United States Patent
Xu et al.

(10) Patent No.: US 11,949,434 B2
(45) Date of Patent: Apr. 2, 2024

(54) LOW LATENCY COMMUNICATION WITH CARRIER-AGGREGATION-BASED FOUNTAIN CODES

(71) Applicant: Qualcomm Incorporated, San Diego, CA (US)

(72) Inventors: Changlong Xu, Beijing (CN); Tao Luo, San Diego, CA (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/761,262

(22) PCT Filed: Sep. 20, 2019

(86) PCT No.: PCT/CN2019/106945
§ 371 (c)(1),
(2) Date: Mar. 17, 2022

(87) PCT Pub. No.: WO2021/051380
PCT Pub. Date: Mar. 25, 2021

(65) Prior Publication Data
US 2022/0376710 A1    Nov. 24, 2022

(51) Int. Cl.
*H03M 13/37*     (2006.01)
*H04L 1/00*      (2006.01)

(52) U.S. Cl.
CPC ...... *H03M 13/3761* (2013.01); *H04L 1/0041* (2013.01); *H04L 1/0045* (2013.01)

(58) Field of Classification Search
CPC ............. H03M 13/3761; H04L 1/0041; H04L 1/0045; H04L 1/0061
See application file for complete search history.

(56) References Cited

U.S. PATENT DOCUMENTS

| | | |
|---|---|---|
| 8,514,779 B2 | 8/2013 | Ozturk et al. |
| 9,590,832 B1 | 3/2017 | Zhang et al. |

(Continued)

FOREIGN PATENT DOCUMENTS

| | | |
|---|---|---|
| CN | 102396175 A | 3/2012 |
| CN | 109168196 A | 1/2019 |

(Continued)

OTHER PUBLICATIONS

Yang et al., Coding for a network coded fountain, IEEE, pp. 2647 to 2651. (Year: 2011).*

(Continued)

*Primary Examiner* — Shelly A Chase
(74) *Attorney, Agent, or Firm* — Holland & Hart LLP

(57) ABSTRACT

Methods, systems, and devices for wireless communications are described. An encoding device (e.g., a user equipment (UE) or a base station) may divide one or more data units (e.g., packet data convergence protocol (PDCP) protocol data units (PDU)) into a set of data blocks. The encoding device may encode the set of data blocks using a fountain code and may generate a set of data units (e.g., radio link control (RLC) PDUs) based on encoding the set of data blocks using the fountain code. The UE may allocate a first subset of the set of data units to a first carrier and a second subset of the set of data units to a second carrier and may transmit the first subset over the first carrier and the second subset over the second carrier.

33 Claims, 21 Drawing Sheets

(56) References Cited

U.S. PATENT DOCUMENTS

| | | |
|---|---|---|
| 2006/0209669 A1 | 9/2006 | Nishio |
| 2007/0030825 A1 | 2/2007 | Pasanen et al. |
| 2008/0069242 A1* | 3/2008 | Xu ................. H04N 19/89 |
| | | 375/E7.279 |
| 2009/0196294 A1 | 8/2009 | Black et al. |
| 2009/0257387 A1 | 10/2009 | Gholmieh et al. |
| 2010/0100792 A1* | 4/2010 | Abu-Surra ........ H03M 13/6525 |
| | | 714/755 |
| 2010/0215006 A1 | 8/2010 | Ho et al. |
| 2012/0057560 A1 | 3/2012 | Park et al. |
| 2013/0044835 A1 | 2/2013 | Sevin et al. |
| 2016/0044835 A1* | 2/2016 | Lee .................. H05K 9/0032 |
| | | 29/841 |
| 2017/0118673 A1* | 4/2017 | Narasimha ............ H04L 1/1671 |
| 2018/0206174 A1* | 7/2018 | Zhou ................. H04W 52/0229 |
| 2018/0376457 A1 | 12/2018 | Tseng et al. |
| 2019/0081746 A1 | 3/2019 | Han et al. |
| 2022/0337337 A1 | 10/2022 | Xu et al. |

FOREIGN PATENT DOCUMENTS

| | | |
|---|---|---|
| WO | WO-2010120732 | 10/2010 |
| WO | WO-2012167563 A1 | 12/2012 |
| WO | WO-2018121863 A1 | 7/2018 |
| WO | WO-2021031052 A1 | 2/2021 |

OTHER PUBLICATIONS

Supplementary European Search Report—EP19945861—Search Authority—Munich—dated May 4, 2023.
International Search Report and Written Opinion—PCT/CN2019/106945—ISA/EPO—dated May 27, 2020.

* cited by examiner

LOW LATENCY COMMUNICATION WITH CARRIER-AGGREGATION-BASED FOUNTAIN CODES

CROSS REFERENCE

The present Application is a 371 national stage filing of International PCT Application No. PCT/CN2019/106945 by Xu et al., entitled "LOW LATENCY COMMUNICATION WITH CARRIER-AGGREGATION-BASED FOUNTAIN CODES," filed Sep. 20, 2019, which is assigned to the assignee hereof, and which is expressly incorporated by reference in its entirety herein.

BACKGROUND

The following relates generally to wireless communications, and more specifically to low latency communication with carrier aggregation based fountain code operation.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some cases, a UE may map a packet data convergence protocol (PDCP) protocol data unit (PDU) to a radio link control (RLC) PDU and may transmit the RLC PDU over a carrier. If a base station fails to successfully decode the RLC PDU, the base station may transmit a request for the UE to transmit a retransmission of the RLC PDU. When the base station requests a retransmission, the time between the UE transmitting the original RLC PDU and the base station successfully decoding the retransmitted RLC PDU may be greater than the time between the UE transmitting the original RLC PDU and the base station successfully decoding the original RLC PDU. As such, latency may be increased, among other problems, when the base station requests a retransmission.

SUMMARY

The described techniques relate to improved methods, systems, devices, and apparatuses that support low latency communication with carrier aggregation based fountain code operation. Generally, the described techniques provide for an encoding device (e.g., a user equipment (UE), a base station) to divide one or more data units (e.g., packet data convergence protocol (PDCP) protocol data units (PDU)) into a set of data blocks. The encoding device may encode the set of data blocks using a fountain code and may generate a set of data units (e.g., radio link control (RLC) PDUs) based on encoding the set of data blocks using the fountain code. The UE may allocate a first subset of the set of data units to a first carrier and a second subset of the set of data units to a second carrier and may transmit the first subset of the set of data units over the first carrier and the second subset of the set of data units over the second carrier.

Additionally or alternatively, the described techniques may provide for a decoding device (e.g., a UE or base station) to receive a first number of data units (e.g., RLC PDUs) over a first carrier and a second number of data units (e.g., additional RLC PDUs) over a second carrier. The decoding device may construct, based on the first number of data units or the second number of data units or both, a generator matrix associated with a fountain code and may determine a set of data blocks based on constructing the generator matrix. The decoding device may aggregate the set of data blocks into one or more data units (e.g., one or more PDCP PDUs).

A method for wireless communication is described. The method may include dividing one or more data units into a set of data blocks, encoding the set of data blocks using a fountain code, generating a set of data units based on encoding the set of data blocks using the fountain code, allocating a first subset of the set of data units to a first carrier and a second subset of the set of data units to a second carrier, and transmitting the first subset of the set of data units over the first carrier and the second subset of the set of data units over the second carrier.

An apparatus for wireless communication is described. The apparatus may include a processor, memory in electronic communication with the processor, and instructions stored in the memory. The instructions may be executable by the processor to cause the apparatus to divide one or more data units into a set of data blocks, encode the set of data blocks using a fountain code, generate a set of data units based on encoding the set of data blocks using the fountain code, allocate a first subset of the set of data units to a first carrier and a second subset of the set of data units to a second carrier, and transmit the first subset of the set of data units over the first carrier and the second subset of the set of data units over the second carrier.

Another apparatus for wireless communication is described. The apparatus may include means for dividing one or more data units into a set of data blocks, means for encoding the set of data blocks using a fountain code, means for generating a set of data units based on encoding the set of data blocks using the fountain code, means for allocating a first subset of the set of data units to a first carrier and a second subset of the set of data units to a second carrier, and means for transmitting the first subset of the set of data units over the first carrier and the second subset of the set of data units over the second carrier.

A non-transitory computer-readable medium storing code for wireless communication is described. The code may include instructions executable by a processor to divide one or more data units into a set of data blocks, encode the set of data blocks using a fountain code, generate a set of data units based on encoding the set of data blocks using the fountain code, allocate a first subset of the set of data units to a first carrier and a second subset of the set of data units to a second carrier, and transmit the first subset of the set of data units over the first carrier and the second subset of the set of data units over the second carrier.

In some examples of the method, apparatuses, and non-transitory computer-readable medium described herein, concatenating each of the multiple data units, where dividing the one or more data units into the set of data blocks may include operations, features, means, or instructions for dividing the concatenated multiple data units into the set of data blocks.

Some examples of the method, apparatuses, and non-transitory computer-readable medium described herein may further include operations, features, means, or instructions for determining that at least one of the multiple data units fails to satisfy a size threshold, where concatenating each of the multiple data units may be based on determining that the at least one of the multiple data units fails to satisfy the size threshold.

In some examples of the method, apparatuses, and non-transitory computer-readable medium described herein, the one or more data units include a single data unit, the method further including determining that the single data unit satisfies a size threshold, where dividing one or more data units into the set of data blocks may be based on determining that the single data unit satisfies the size threshold.

Some examples of the method, apparatuses, and non-transitory computer-readable medium described herein may further include operations, features, means, or instructions for receiving an indication of a total quantity of data blocks for the set of data blocks and an indication of a total quantity of data units for the set of data units, where dividing the one or more data units into the set of data blocks may be based on the indicated total quantity of data blocks and where generating the set of data units may be based on the indicated total quantity of data units.

In some examples of the method, apparatuses, and non-transitory computer-readable medium described herein, transmitting the indication of the total quantity of data blocks and the indication of the total quantity of data units may include operations, features, means, or instructions for transmitting via radio resource control signaling.

Some examples of the method, apparatuses, and non-transitory computer-readable medium described herein may further include operations, features, means, or instructions for receiving an indication of a generator matrix corresponding to the fountain code, and generating the set of data units based on receiving the indication of the generator matrix.

Some examples of the method, apparatuses, and non-transitory computer-readable medium described herein may further include operations, features, means, or instructions for receiving a set of parameters to construct a generator matrix corresponding to a fountain code, and constructing the generator matrix using the set of parameters, where generating the set of data units may be based on constructing the generator matrix.

In some examples of the method, apparatuses, and non-transitory computer-readable medium described herein, receiving the set of parameters to construct the generator matrix corresponding to the fountain code may include operations, features, means, or instructions for receiving via radio resource control signaling.

In some examples of the method, apparatuses, and non-transitory computer-readable medium described herein, transmitting the first subset of the set of data units over the first carrier and the second subset of the set of data units over the second carrier may include operations, features, means, or instructions for transmitting the first subset of the set of data units containing a different total quantity of data units than the second subset of the set of data units.

Some examples of the method, apparatuses, and non-transitory computer-readable medium described herein may further include operations, features, means, or instructions for comparing a channel condition of the first carrier with a channel condition of the second carrier, where the allocating includes allocating the first subset of the set of data units to the first carrier and the second subset of the set of data units to the second carrier such that the first subset of the set of data units contains a different total quantity of data units from the second subset of the set of data units based on comparing the channel condition of the first carrier with the channel condition of the second carrier.

In some examples of the method, apparatuses, and non-transitory computer-readable medium described herein, comparing the channel condition of the first carrier with the channel condition of the second carrier may include operations, features, means, or instructions for determining that the first carrier may have a higher link quality than the second carrier, where the allocating includes allocating the first subset of the set of data units to the first carrier and the second subset of the set of data units to the second carrier such that the first subset of the set of data units contains a greater quantity of total data units than the second subset of the set of data units based on determining that the first carrier may have a higher link quality than the second carrier.

Some examples of the method, apparatuses, and non-transitory computer-readable medium described herein may further include operations, features, means, or instructions for transmitting a third subset of a second set of data units over the first carrier before transmitting the first subset of the set of data units, where the allocating includes allocating the first subset of the set of data units to the first carrier such that the first subset of the set of data units contains a different total quantity of data units than the third subset based on comparing the channel condition of the first carrier with the channel condition of the second carrier.

In some examples of the method, apparatuses, and non-transitory computer-readable medium described herein, generating the set of data units may include operations, features, means, or instructions for generating a set of packets based on encoding the set of data blocks using the fountain code, and mapping each of the set of packets to a respective data unit of the set of data units.

Some examples of the method, apparatuses, and non-transitory computer-readable medium described herein may further include operations, features, means, or instructions for determining a channel condition of at least one of the first carrier or the second carrier, and determining a total quantity of data units for the set of data units based on determining the channel condition, where generating the set of data units may be based on determining the total quantity of data units for the set of data units.

In some examples of the method, apparatuses, and non-transitory computer-readable medium described herein, at least one data unit of the set of data units transmitted includes a header indicating whether the data unit was encoded using the fountain code.

In some examples of the method, apparatuses, and non-transitory computer-readable medium described herein, the header includes a sequence number corresponding to the fountain code.

In some examples of the method, apparatuses, and non-transitory computer-readable medium described herein, the header includes a second sequence number located immediately before the sequence number corresponding to the fountain code.

In some examples of the method, apparatuses, and non-transitory computer-readable medium described herein, the header indicates that the data unit was encoded using the fountain code based on one or more bits of the header corresponding to an indication of whether the data unit includes data or control information, one or more bits corresponding to an indication of segment information for the data unit, one or more bits specific to indicating that the data unit was encoded using the fountain code, or any combination thereof.

In some examples of the method, apparatuses, and non-transitory computer-readable medium described herein, a total quantity of data blocks in the set of data blocks may be based on a size of a service data unit, a generator matrix, or both.

In some examples of the method, apparatuses, and non-transitory computer-readable medium described herein, the one or more data units include packet data convergence protocol data units.

In some examples of the method, apparatuses, and non-transitory computer-readable medium described herein, each of the set of data units may be a radio link control protocol data unit.

A method for wireless communication is described. The method may include receiving a first set of data units over a first carrier and a second set of data units over a second carrier, constructing, based on the first set of data units and the second set of data units, a generator matrix associated with a fountain code, determining a set of data blocks based on constructing the generator matrix, and aggregating the set of data blocks into one or more data units.

An apparatus for wireless communication is described. The apparatus may include a processor, memory in electronic communication with the processor, and instructions stored in the memory. The instructions may be executable by the processor to cause the apparatus to receive a first set of data units over a first carrier and a second set of data units over a second carrier, construct, based on the first set of data units and the second set of data units, a generator matrix associated with a fountain code, determine a set of data blocks based on constructing the generator matrix, and aggregate the set of data blocks into one or more data units.

Another apparatus for wireless communication is described. The apparatus may include means for receiving a first set of data units over a first carrier and a second set of data units over a second carrier, means for constructing, based on the first set of data units and the second set of data units, a generator matrix associated with a fountain code, means for determining a set of data blocks based on constructing the generator matrix, and means for aggregating the set of data blocks into one or more data units.

A non-transitory computer-readable medium storing code for wireless communication is described. The code may include instructions executable by a processor to receive a first set of data units over a first carrier and a second set of data units over a second carrier, construct, based on the first set of data units and the second set of data units, a generator matrix associated with a fountain code, determine a set of data blocks based on constructing the generator matrix, and aggregate the set of data blocks into one or more data units.

Some examples of the method, apparatuses, and non-transitory computer-readable medium described herein may further include operations, features, means, or instructions for determining that a combined total quantity of data units in the first set of data units and the second set of data units satisfies a quantity threshold, where determining the set of data blocks may be based on the combined total quantity of data units satisfying the quantity threshold.

In some examples of the method, apparatuses, and non-transitory computer-readable medium described herein, determining that the combined total quantity of data units in the first set of data units and the second set of data units satisfies a quantity threshold may include operations, features, means, or instructions for determining that the combined total quantity of data units may be greater than a total quantity of data blocks of the set of data blocks.

Some examples of the method, apparatuses, and non-transitory computer-readable medium described herein may further include operations, features, means, or instructions for transmitting an indication of a total quantity of data blocks of the set of data blocks, an indication of a total quantity of data units of a set of data units, or both.

In some examples of the method, apparatuses, and non-transitory computer-readable medium described herein, transmitting the indication of the total quantity of data blocks, the indication of the total quantity of data units, or both may include operations, features, means, or instructions for transmitting via radio resource control signaling.

Some examples of the method, apparatuses, and non-transitory computer-readable medium described herein may further include operations, features, means, or instructions for transmitting an indication of a mother generator matrix corresponding to the generator matrix.

Some examples of the method, apparatuses, and non-transitory computer-readable medium described herein may further include operations, features, means, or instructions for transmitting a set of parameters to construct a mother generator matrix.

In some examples of the method, apparatuses, and non-transitory computer-readable medium described herein, transmitting the set of parameters may include operations, features, means, or instructions for transmitting via radio resource control signaling.

In some examples of the method, apparatuses, and non-transitory computer-readable medium described herein, receiving the first set of data units over the first carrier and the second set of data units over the second carrier may include operations, features, means, or instructions for receiving the first set of data units including a different total quantity of data units than the second set of data units.

In some examples of the method, apparatuses, and non-transitory computer-readable medium described herein, receiving the first set of data units over the first carrier and the second set of data units over the second carrier may include operations, features, means, or instructions for receiving the first set of data units including a different total quantity of data units than the second set of data units when a channel condition of the first carrier may be different than a channel condition of the second carrier.

In some examples of the method, apparatuses, and non-transitory computer-readable medium described herein, receiving the first set of data units including the different quantity of data units than the second set of data units may include operations, features, means, or instructions for receiving the first set of data units containing a greater total quantity of data units than the second carrier when the first carrier may have a higher link quality than the second carrier.

Some examples of the method, apparatuses, and non-transitory computer-readable medium described herein may further include operations, features, means, or instructions for receiving a third set of data units on the first carrier before receiving the first set of data units, where a total quantity of data units of the third set of data units may be different than a total quantity of data units of the first set of data units when a channel condition associated with the first carrier while receiving the third set of data units may be different than a channel condition associated with the first carrier while receiving the first set of data units.

Some examples of the method, apparatuses, and non-transitory computer-readable medium described herein may further include operations, features, means, or instructions for aggregating the first set of data units and the second set of data units into a set of data units, where the first set of data units may be a first subset of the set of data units and the second set of data units may be a second subset of the set of data units, and where determining the set of data blocks may be based on the set of data units.

Some examples of the method, apparatuses, and non-transitory computer-readable medium described herein may further include operations, features, means, or instructions for mapping each of the set of data units to a respective packet of a set of packets, where determining the set of data blocks may be based on mapping each of the set of data units to the respective packet of the set of packets.

In some examples of the method, apparatuses, and non-transitory computer-readable medium described herein, at least one data unit of the first set or the second set includes a header indicating whether the data unit was encoded using the fountain code.

In some examples of the method, apparatuses, and non-transitory computer-readable medium described herein, the header includes a sequence number corresponding to the fountain code.

In some examples of the method, apparatuses, and non-transitory computer-readable medium described herein, the header includes a second sequence number located immediately before the sequence number corresponding to the fountain code.

In some examples of the method, apparatuses, and non-transitory computer-readable medium described herein, the header indicates that the data unit was encoded using the fountain code based on one or more bits of the header corresponding to an indication of whether the data unit includes data or control information, one or more bits corresponding to an indication of segment information for the data unit, one or more bits specific to indicating that the data unit was encoded using the fountain code, or any combination thereof.

In some examples of the method, apparatuses, and non-transitory computer-readable medium described herein, a total quantity of data blocks in the set of data blocks may be based on a size of a service data unit, the generator matrix, or a combination thereof.

In some examples of the method, apparatuses, and non-transitory computer-readable medium described herein, the one or more data units may be packet data convergence protocol data units.

In some examples of the method, apparatuses, and non-transitory computer-readable medium described herein, each of the first and second pluralities of data units may be a radio link control protocol data unit.

DETAILED DESCRIPTION

Figure 1:
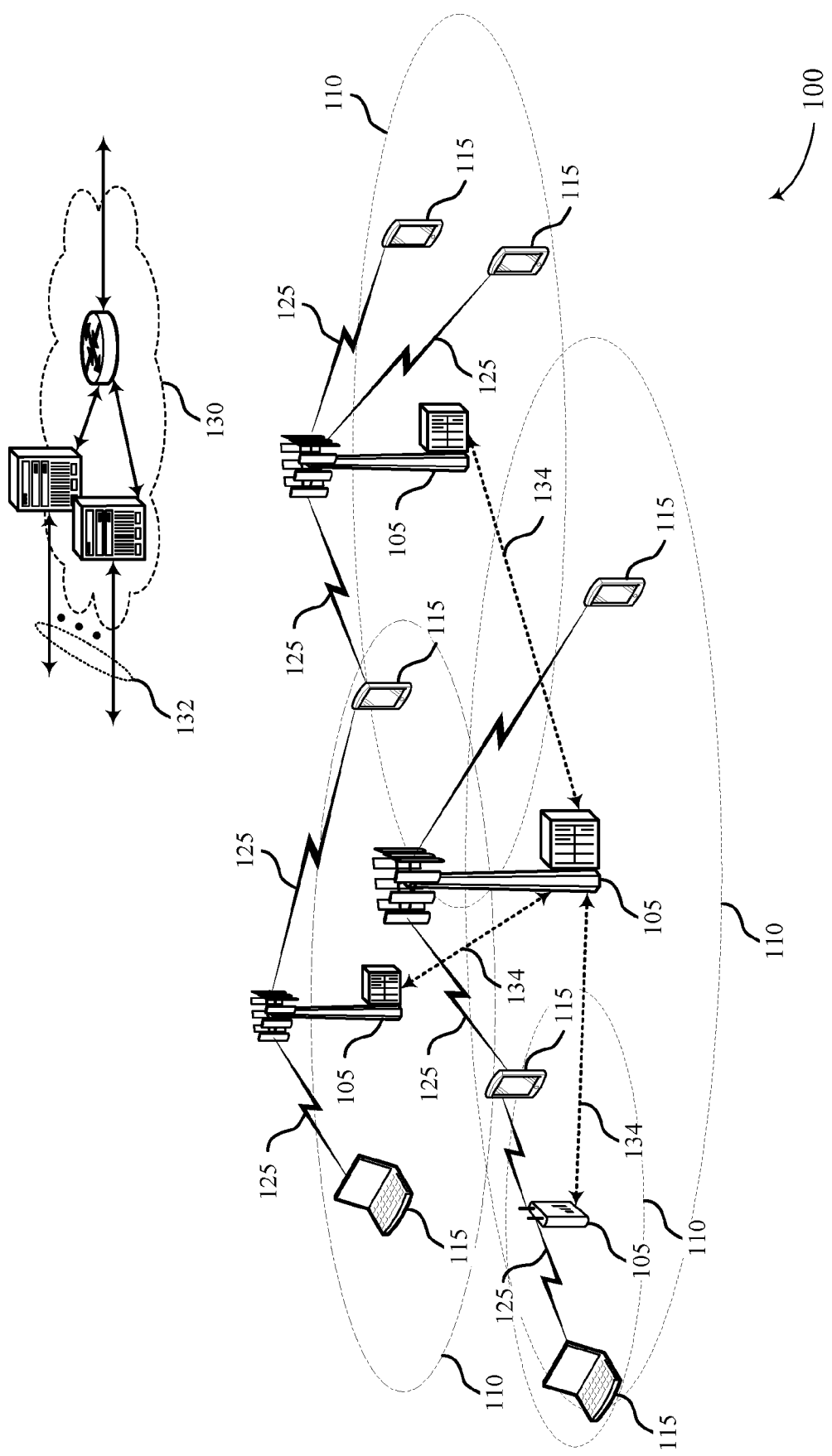
FIG. 1 illustrates an example of a system for wireless communications that supports low latency communication with carrier aggregation based fountain code operation in accordance with aspects of the present disclosure.

In some cases, a first device, such as a user equipment (UE), may map one or more packet data convergence protocol (PDCP) protocol data units (PDUs) to one or more radio link control (RLC) PDUs and may transmit the RLC PDUs to a second device, such as a base station, over a carrier. Assuming that the second device receives the RLC PDUs with a high enough signal strength and a low enough amount of interference, the second device may be able to successfully decode each of the RLC PDUs. However, if any of the RLC PDUs are received with too high interference, the second device may fail to decode those RLC PDUs. To enable the second device to still receive the data contained in those RLC PDUs, the second device may send an indication that the second device failed to successfully decode at least some of the RLC PDUs to the first device and the first device, in turn, may retransmit those RLC PDUs. But transmitting this indication and waiting to receive the retransmitted RLC PDUs may be associated with an increased latency compared to successfully decoding each of the RLC PDUs from the first transmission.

To decrease a chance that the second device experiences the increased latency associated with waiting for a retransmission, the first device may transmit duplicate RLC PDUs over two carriers. If the second device fails to successfully decode a duplicate RLC PDU over one carrier, the second device may successfully decode the duplicate RLC PDU over the other carrier. As such, the second device may have a greater chance of successfully decoding the RLC PDUs without a retransmission and may, thus, be less likely to experience the increased latency associated with waiting for the retransmission. By using two carriers, however, such a method may involve the first device communicating over twice the number of resources for the same amount of data, which may increase overhead associated with receiving the data.

To mitigate the increased overhead associated with duplicating RLC PDUs while still limiting the probability of waiting for a retransmission, a first device may split the one or more PDCP PDUs into K data blocks and may encode the K data blocks, for example, using a fountain code to generate N RLC PDUs. The N RLC PDUs may be split among the two carriers and may be sent via the two carriers to the second device. Generally, as long as enough RLC PDUs are successfully received and decoded by the second device (e.g., as long as the second device successfully receives and decodes K of the RLC PDUs), the second device may be able to determine the K data blocks that were encoded by the first device. As the carriers may not be limited to containing duplicate information, more data may be transmitted than by the duplicate-based approach, thus decreasing overhead.

Aspects of the disclosure are initially described in the context of a wireless communications system. Further aspects of the disclosure are described in the context of an additional wireless communications system, an encoding process, RLC PDU formats, a process flow. Aspects of the disclosure are further illustrated by and described with reference to apparatus diagrams, system diagrams, and flowcharts that relate to low latency communication with carrier aggregation based fountain code operation.

FIG. 1 illustrates an example of a wireless communications system 100 that supports low latency communication with carrier aggregation based fountain code operation in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, because the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some examples, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as Tf=307,200 $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a defined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

Wireless communications systems are widely deployed to provide various types of communication content such as voice, video, packet data, messaging, broadcast, and so on. These systems may be multiple-access systems capable of supporting communication with multiple users by sharing the available system resources (e.g., time, frequency, and power). A wireless network, for example a wireless local area network (WLAN), such as a Wi-Fi (i.e., Institute of Electrical and Electronics Engineers (IEEE) 802.11) network may include an access point (AP) that may communicate with one or more wireless or mobile devices. The AP may be coupled to a network, such as the Internet, and may enable a mobile device to communicate via the network (or communicate with other devices coupled to the access point). A wireless device may communicate with a network device bi-directionally. For example, in a WLAN, a device may communicate with an associated AP via downlink (e.g., the communication link from the AP to the device) and uplink (e.g., the communication link from the device to the AP). A wireless personal area network (PAN), which may include a Bluetooth connection, may provide for short range wireless connections between two or more paired wireless devices. For example, wireless devices such as cellular phones may utilize wireless PAN communications to exchange information such as audio signals with wireless headsets.

The described techniques relate to improved methods, systems, devices, and apparatuses that support low latency communication with carrier aggregation based fountain code operation. Generally, the described techniques provide for an encoding device (e.g., a UE 115 or a base station 105) to divide one or more data units (e.g., PDCP PDUs) into a set of data blocks. The encoding device may encode the set of data blocks using a fountain code and may generate a set of data units (e.g., RLC PDUs) based on encoding the set of data blocks using the fountain code. The UE may allocate a first subset of the set of data units to a first carrier and a second subset of the set of data units to a second carrier and may transmit the first subset over the first carrier and the second subset over the second carrier.

Additionally or alternatively, the described techniques may provide for a decoding device (e.g., a UE 115 or base station 105) to receive a first number of data units (e.g., RLC PDUs) over a first carrier and a second number of data units (e.g., additional RLC PDUs) over a second carrier. The decoding device may construct, based on one the first and second number of data units, a generator matrix associated with a fountain code and may determine a set of data blocks based on constructing the generator matrix. The decoding device may aggregate the set of data blocks in to one or more data units (e.g., one or more PDCP PDUs).

Figure 2:
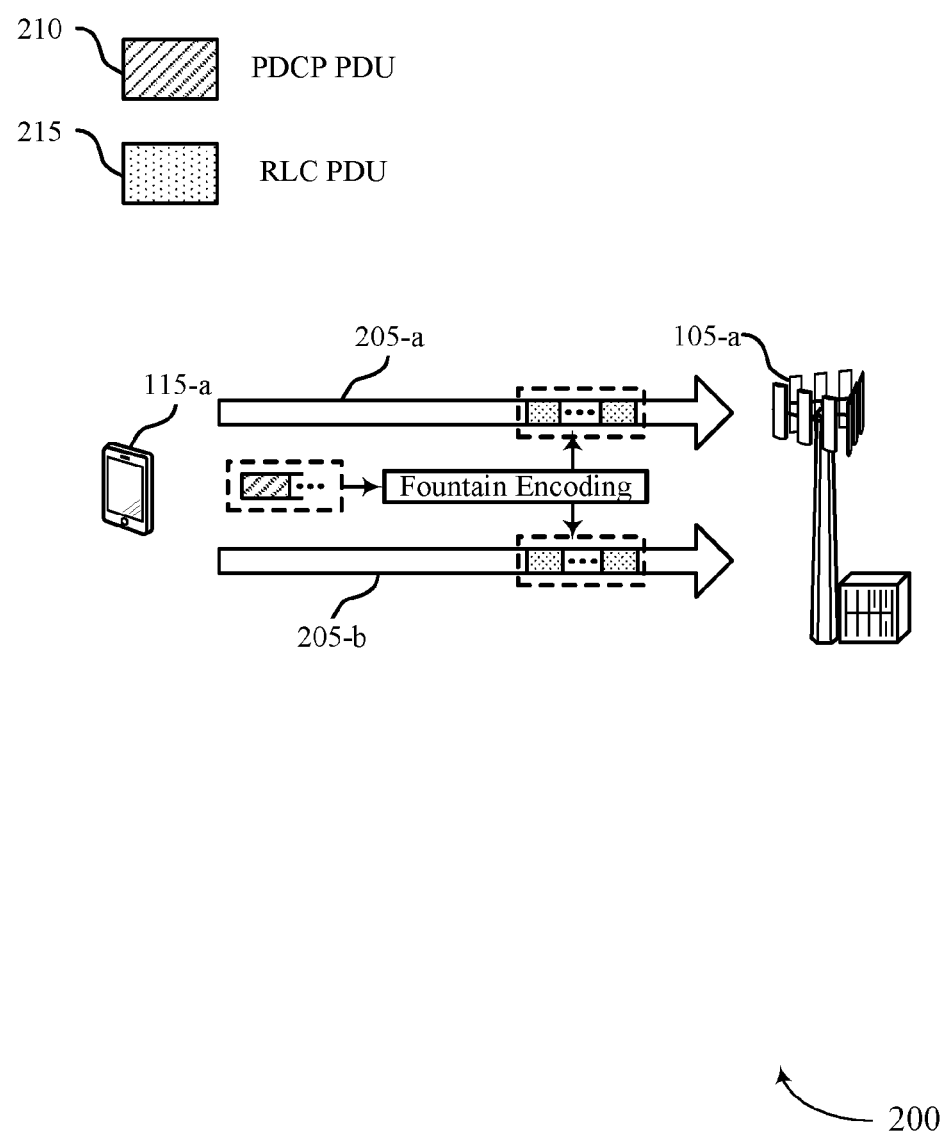
FIG. 2 illustrates an example of a wireless communications system that supports low latency communication with carrier aggregation based fountain code operation in accordance with aspects of the present disclosure.

FIG. 2 illustrates an example of a wireless communications system 200 that supports low latency communication with carrier aggregation based fountain code operation in accordance with aspects of the present disclosure. In some examples, wireless communications system 200 may implement aspects of wireless communications system 100. For instance, UE 115-*a* may be an example of a UE 115 as described with reference to FIG. 1 and base station 105-*a* may be an example of a base station 105 as described with reference to FIG. 1. Another encoding device (e.g., a base station 105) may be substituted for UE 115-*a* and/or that another decoding device (e.g., a UE 115) may be substituted for base station 105-*a* without deviating from the scope of the present disclosure.

UE 115-*a* may transmit data to base station 105-*a* via carriers 205-*a* and 205-*b*. For instance, UE 115-*a* may identify one or more PDCP PDUs 210 as an RLC SDU and may divide the RLC SDU into a set of K data blocks. UE 115-*a* may perform fountain encoding, which may be a type of network coding, on the K data blocks to generate a set of N RLC PDUs 215. UE 115-*a* may map a first subset (e.g., M of the RLC PDUs 215) to the first carrier 205-*a* and may a second subset (e.g., the N-M remaining RLC PDUs 215) to the second carrier 205-*b*. UE 115-*a* may proceed to transmit the first subset over carrier 205-*a* and the second subset over carrier 205-*b*. More details about the encoding process may be described with reference to FIG. 3.

Base station 105-*a* may receive and successfully decode at least some of the first subset of the RLC PDUs 215 and at least some of the second subset of RLC PDUs 215 (e.g., Q, where Q≤N). Assuming that the number of RLC PDUs 215 successfully decoded is greater than a threshold amount (e.g., greater than K), base station 105-*a* may construct an invertible generator matrix G from the decoded RLC PDUs 215. For instance, base station 105-*a* may identify a header for a first of the RLC PDUs 215 and may identify, from the header, a column of a mother generator matrix H stored at base station 105-a and UE 115-a. Base station 105-a may perform this identification for each of the decoded RLC PDUs and may construct the invertible generator matrix by mapping each of the identified columns of the mother generator matrix H to a column of the invertible generator matrix G.

In some examples, if a first RLC PDU 215 indicates column #2 of the mother generator matrix H, a second RLC PDU 215 indicates column #6 of the mother generator matrix H, and a third RLC PDU 215 indicates column #12 of the mother generator matrix H, and assuming that none of the remaining RLC PDUs 215 indicate columns #1, #2-#4, and #7-#11, column #2 may map to a first column of the invertible generator matrix G, column #6 may map to a second column of the invertible generator matrix G, and column #12 may map to a third column of the invertible generator matrix G. Both the mother generator matrix H and the invertible generator matrix G may have K rows and may have entries consisting of 1's, 0's, or both.

Once base station 105-a generates the invertible generator matrix G, base station 105-a may reconstruct the K data blocks and the one or more PDCP PDUs 210 based on the invertible generator matrix G and the decoded RLC PDUs 215. For instance, if each of the K recovered data blocks are denoted by $d_k$, where $0<k \leq K$, and each of the data portions of the RLC PDUs 215 is denoted by $p_q$, where $0<q \leq Q$, then $d_k$ may be equal to $\Sigma_{q=1}^{Q} p_q G_{qk}^{-1}$, where $G_{qk}^{-}$ may represent a qth row and a kth column of the inverted generator matrix $G^{-1}$. Generally, the data blocks may be recovered if invertible generator matrix G according to the Q data blocks is invertible or if the rank of invertible generator matrix G is K.

In some cases, base station 105-a may provide control signaling (e.g., RRC signaling) to UE 115-a that configures a value of K, a value of N, or a combination thereof. Additionally or alternatively, base station 105-a may provide an indication of the mother generator matrix. In some examples, base station 105-a may transmit the entire mother generator matrix to UE 115-a (e.g., via RRC signaling). In another example, base station 105-a may transmit (e.g., via RRC signaling) one or more parameters that UE 115-a may use to construct the mother generator matrix.

Performing the fountain code-based RLC PDU transmission may have a number of advantages compared to the duplicate-based approach. For instance, the duplicate-based approach may have a lower efficiency of PDU transmission than the fountain-code based approach. For instance, the duplicate-based approach involve transmission of each RLC PDU twice over two carriers, which may result in more resources being used as compared to transmitting an RLC PDU on one of the two carriers but not the other. In some cases, the duplicate-based approach may experience increased latency if earlier RLC PDUs come later and duplicate PDUs may be discarded.

Additionally or alternatively, the duplicate-based approach may waste more resources for the physical (PHY) and/or MAC layers. For instance, the duplicate-based approach may involve doubling resources for duplication of PDCP and have worse performance than sending a PDU over carrier but not the other when the channel quality is low. In some cases, the total size of the receive subblocks or RLC PDUs may be slightly larger than that of original PDUs (e.g., original PDCP PDUs).

In contrast to the duplicate-based approach, the fountain code based approach may not depend on an order of the receive subblocks or RLC PDUs. Additionally, each of the receive subblocks or RLC PDUs may be used for decoding, whereas half of the receive subblocks or RLC PDUs in the duplicate-based approach may be redundant. As such, the latency associated with the fountain code based approach may be lower than that of the duplicate-based approach. Additionally, the total size of the RLC PDUs may be slightly larger than that of the RLC PDUs of the duplicate-based approach and the number of transmit PDUs may be larger than a constraint for decoding. As such, the fountain code based approach may have an increased efficiency as compared to the duplicate based approach. The fountain code based approach may also have backwards compatibility with legacy UEs 115 (e.g., UEs 115 operable to perform PDCP PDU duplication as described herein).

Figure 3:
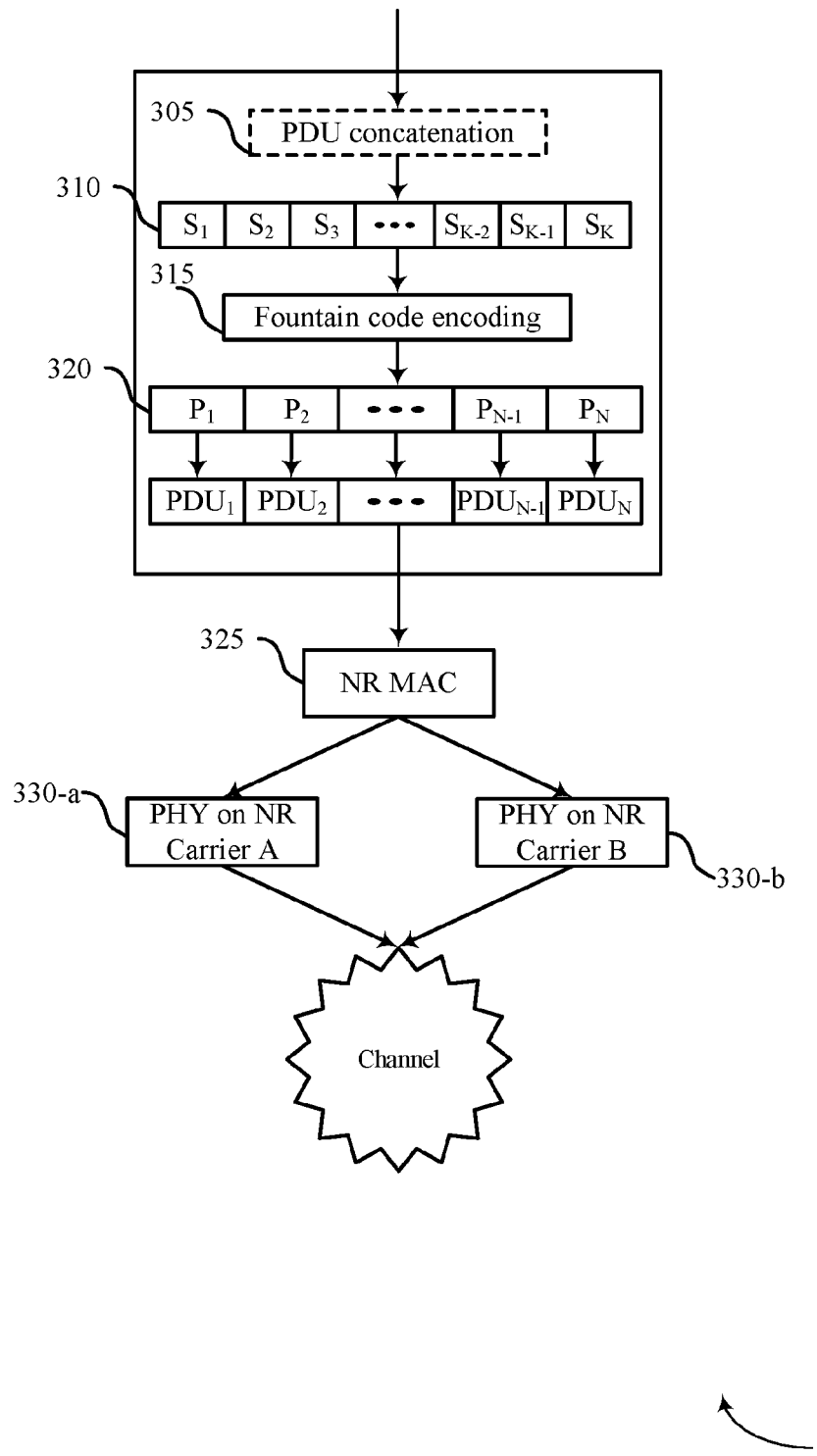
FIG. 3 illustrates an example of an encoding process that supports low latency communication with carrier aggregation based fountain code operation in accordance with aspects of the present disclosure.

FIG. 3 illustrates an example of an encoding process 300 that supports low latency communication with carrier aggregation based fountain code operation in accordance with aspects of the present disclosure. In some examples, encoding process 300 may implement aspects of wireless communications system 100. For instance, encoding process 300 may be implemented by a UE 115 or a base station 105 as described with reference to FIG. 1. Generally, encoding process 300 may represent a process by which a UE 115 or a base station 105 may use fountain encoding generate a set of RLC PDUs from one or more PDCP PDUs. In some cases, a UE 115 may perform encoding process 300 if the RLC PDUs are being sent as part of ultra-reliable low-latency communications (URLLC) and may use other processes (e.g., the duplicate-based approach) if the RLC PDUs are being sent as part of another type of communication. Although encoding process 300 is primarily described with reference to a UE 115, that encoding process may be performed by another encoding device (e.g., a base station 105) without deviating from the scope of the present disclosure.

A UE 115 may determine whether or not a PDCP PDU exceeds a size threshold. If the PDCP PDU exceeds the size threshold, the UE 115 may identify the PDCP PDU as an RLC service data unit (SDU) and may skip 305. However, if the PDCP PDU does not exceed the size threshold, the UE 115 may concatenate PDCP PDUs together at 305 until the concatenated PDCP PDUs satisfy the size threshold. The concatenated PDCP PDUs that satisfy the size threshold may be considered the RLC SDU.

At 310, the UE 115 may divide the RLC SDU into K data blocks $s_1, \ldots, s_K$. Each of the data blocks may contain a same number of bits. Generally, K may be determined using SDU size and the mother generator matrix H. At 315, the UE 115 may perform fountain encoding on the K data blocks to generate N packets $p_1, \ldots, p_N$, where each packet may correspond to a different column of a mother generator matrix. For instance, the UE 115 may determine each of the N packets as $p_n = \Sigma_{k=1}^{K} s_K H_{kn}$, where $H_{kn}$ may represent a value of an entry at a kth row and an nth column of the mother generator matrix H.

Generally, fountain codes may be rateless codes that may have unlimited columns. The mother generator matrix may be invertible with minimum N. N may be determined based on channel conditions of dual connectivity (DC) or carrier aggregation (CA). At 320, the UE 115 may map the N packets to N RLC PDUs. For instance, for a given packet, a UE 115 may add a header to the packet that indicates the column of the mother generator matrix associated with the packet. More details about the format of the RLC PDU may be described with reference to FIGS. 4A and 4B.

At 325, the RLC PDUs may be sorted by an NR MAC into a first subset and a second subset. The first subset may contain M RLC PDUs and may be mapped to a first carrier and the second subset may contain N-M RLC PDUs and may be mapped to a second carrier. Generally, M may be determined based on the channel condition of each carrier. If the first carrier has a better link quality, for instance, than M may be greater than N-M. In some cases, the packets may be allocated to the first carrier and the second carrier interlacely. In some cases, the number of packets allocated may be dynamically adjusted according to the channel condition of each carrier. At 330-a, the M RLC PDUs may be sent in a channel over a first carrier and, at 330-b, the N-M RLC PDUs may be sent in a channel over a second carrier.

Figure 4A:
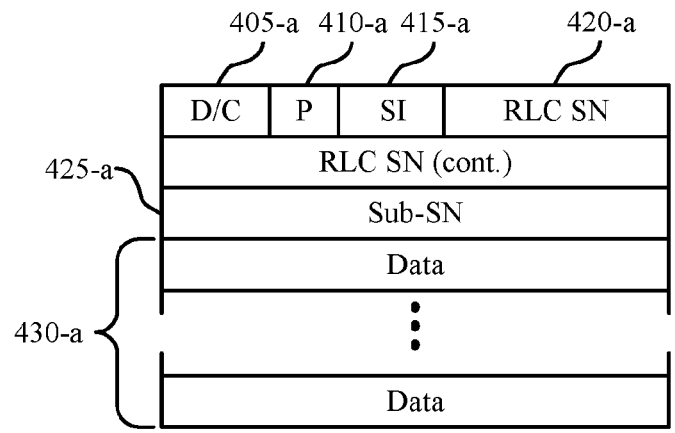
FIGS. 4A and 4B illustrate examples of radio link control (RLC) protocol data unit (PDU) formats that support low latency communication with carrier aggregation based fountain code operation in accordance with aspects of the present disclosure.
Figure 4B:
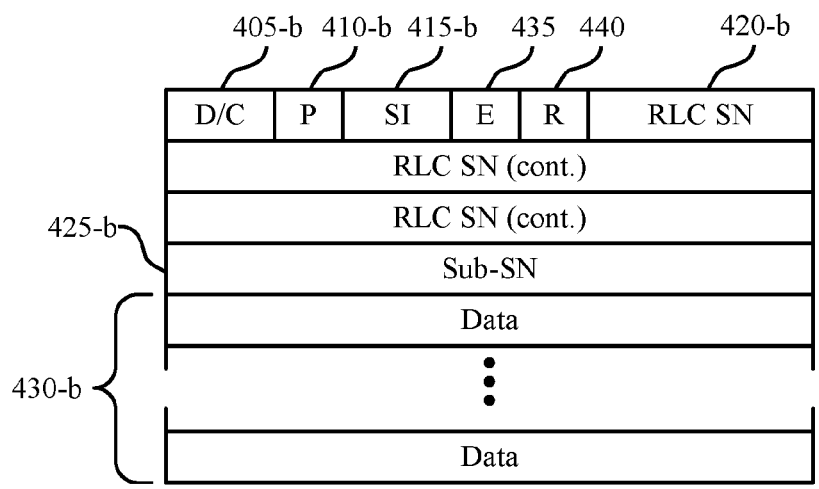

FIGS. 4A and 4B illustrates an example of RLC PDU formats 400-a and 400-b that support low latency communication with carrier aggregation based fountain code operation in accordance with aspects of the present disclosure. In some examples, RLC PDU formats 400-a and 400-b may implement aspects of wireless communications system 100. For instance, a UE 115 or other encoding device (e.g., a base station 105) implementing encoding process 300 may generate RLC PDUs with RLC PDU format 400-a or 400-b.

The header portion of the RLC PDU format 400-a may comprise a data/control (D/C) field 405-a, a P field 410-a, a segmentation information (SI) field 415-a, a RLC sequence number (SN) field 420-a, and a sub-SN field 425-a. The D/C field 405-a may include 1 bit and may indicate whether the RLC PDU contains data or control information. The P field 410-a may include 1 bit and may indicate whether a status report (e.g., an acknowledgement (ACK) or a negative acknowledgement (NACK)) is to be transmitted back upon receiving the RLC PDU. The SI field 415-a may indicate a location of the RLC PDU. The RLC sequence number field 420-a may contain 12 bits and may provide an identifier for the RLC PDU. The sub-SN field 425-a may contain 8 bits and may provide an indication of what column of the mother generator matrix H the RLC PDU maps to. The remaining portion of the RLC PDU format 400-a may include data 430-a. Data 430-a may represent a packet $p_n$ as described above.

To indicate that that fountain encoding has been performed, D/C field 405-a and SI field 415-a may be set to defined values. For instance, D/C field 405-a may be set to 0 and SI field 415-a may be set to 11.

The header portion of the RLC PDU format 400-b may comprise a data/control (D/C) field 405-b, a P field 410-b, a SI field 415-b, an E field 435, an R field 440, a RLC SN field 420-b, and a sub-SN field 425-b. The D/C field 405-b may include 1 bit and may indicate whether the RLC PDU contains data or control information. The P field 410-b may include 1 bit and may indicate whether a status report (e.g., an ACK or a NACK) is to be transmitted back upon receiving the RLC PDU. The SI field 415-b may indicate a location of the RLC PDU. The E field may include 1 bit and may indicate whether or not the packet of the RLC PDU has been encoded using a fountain code. The R field may indicate a number of bits that may be used for a miscellaneous purpose. The RLC sequence number field 420-b may contain 18 bits and may provide an identifier for the RLC PDU. The sub-SN field 425-a may contain 8 bits and may provide an indication of what column of the mother generator matrix H the RLC PDU maps to. The remaining portion of the RLC PDU format 400-b may include data 430-b. Data 430-b may represent a packet $p_n$ as described herein.

Figure 5:
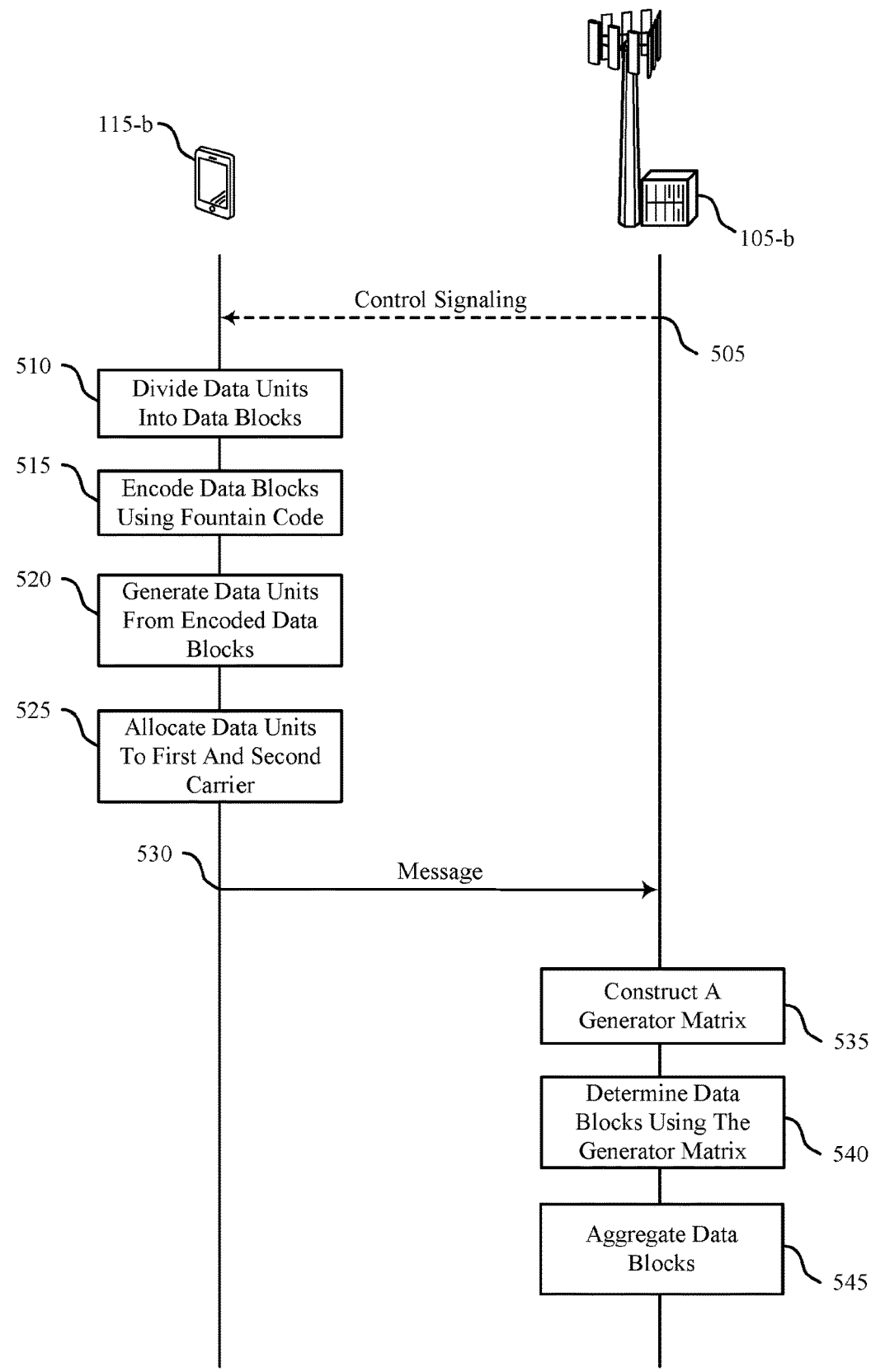
FIG. 5 illustrates an example of a process flow that supports low latency communication with carrier aggregation based fountain code operation in accordance with aspects of the present disclosure.

FIG. 5 illustrates an example of a process flow 500 that supports low latency communication with carrier aggregation based fountain code operation in accordance with aspects of the present disclosure. In some examples, process flow 500 may implement aspects of wireless communications system 100. For instance, UE 115-b may be an example of a UE 115 as described with reference to FIG. 1 and base station 105-b may be an example of a base station 105 as described with reference to FIG. 1. UE 115-b may be replaced by another encoding device (e.g., a base station 105) and/or that base station 105-b may be replaced by another decoding device (e.g., a UE 115) without deviating from the scope of the present disclosure.

At 505, base station 105-b may transmit control signaling (e.g., RRC signaling). The control signaling may include a value for the total quantity of data blocks (e.g., K), a value for the total number of encoded data units (e.g., N), an explicit indication of a mother generator matrix, a set of parameters for constructing a mother generator matrix, or a combination thereof.

At 510, UE 115-b may divide one or more data units (e.g., PDCP PDUs) into a set of data blocks (e.g., K data blocks). In some cases, the one or more data units may consist of multiple data units that have been concatenated together based on determining that a single PDU fails to satisfy a size threshold. Alternatively, if a single PDU satisfies the size threshold, the one or more data units may consist of the single PDU. In some cases, the total quantity of data blocks in the set of data blocks is based on a size of an SDU, a generator matrix, or both.

At 515, UE 115-b may encode the set of data blocks using a fountain code, such as described herein with reference to FIG. 3.

At 520, UE 115-b may generate a set of data units (e.g., N RLC PDUs) based on encoding the set of data blocks using the fountain code. In some cases, generating the set of data units may include generating a set of packets based on encoding the set of data blocks and mapping each of the set of packets to a respective data unit of the set of data units. In some cases, a total quantity of data units for the set of data units may be based on determining channel condition of at least one of the first carrier or the second carrier. In some cases, at least one data unit of the set of data units transmitted includes a header indicating whether the data unit was encoded using the fountain code.

The header may comprise an SN (e.g., a sub-SN) corresponding to the fountain code and may also include a second SN located immediately before the SN. In some cases, the header indicates that the data unit was encoded using the fountain code based on one or more bits of the header corresponding to an indication of whether the data unit comprises data or control information (e.g., a D/C field), one or more bits corresponding to an indication of segment information for the data unit (e.g., a SI field), one or more bits specific to indicating that the data unit was encoded using the fountain code (e.g., E field), or any combination thereof.

At 525, UE 115-b may allocate a first subset of the set of data units to a first carrier (e.g., M of the N data units) and a second subset of the set of data units (e.g., the remaining N-M of the N data units) to a second carrier.

The first subset of the set of data units contains a different total quantity of data units that the second subset of the set of data units. In some cases, the first subset and the second subset may contain the different total quantity of data units based on comparing a channel condition of the first carrier with that of a second carrier. For instance, if the first carrier has a higher link quality than the second carrier, the first subset may contain more data units. In some cases, UE 115-*b* may determine which subset may contain more data units dynamically.

At 530, UE 115-*b* may transmit the first subset of the set of data units over the first carrier and the second subset of the set of data units over the second carrier. Base station 105-*b* may receive and successfully decode at least some of the first and second subsets of data units.

At 535, base station 105-*b* may construct a generator matrix associated with a fountain code based on the successfully decoded data units.

At 540, base station 105-*b* may determine a set of data blocks (e.g., K data blocks) based on identifying the generator matrix. In some cases, determining the set of data blocks may be based on a combined total quantity of data units in the successfully decoded data units satisfying a quantity threshold (e.g., if the total quantity of received data units Q is greater than or equal to K). In some cases, determining the set of data blocks may be based on mapping each of the set of data units to a respective packet of a set of packets.

At 545, base station 105-*b* may aggregate the set of data blocks into one or more data units (e.g., PDCP PDUs).

Figure 6:
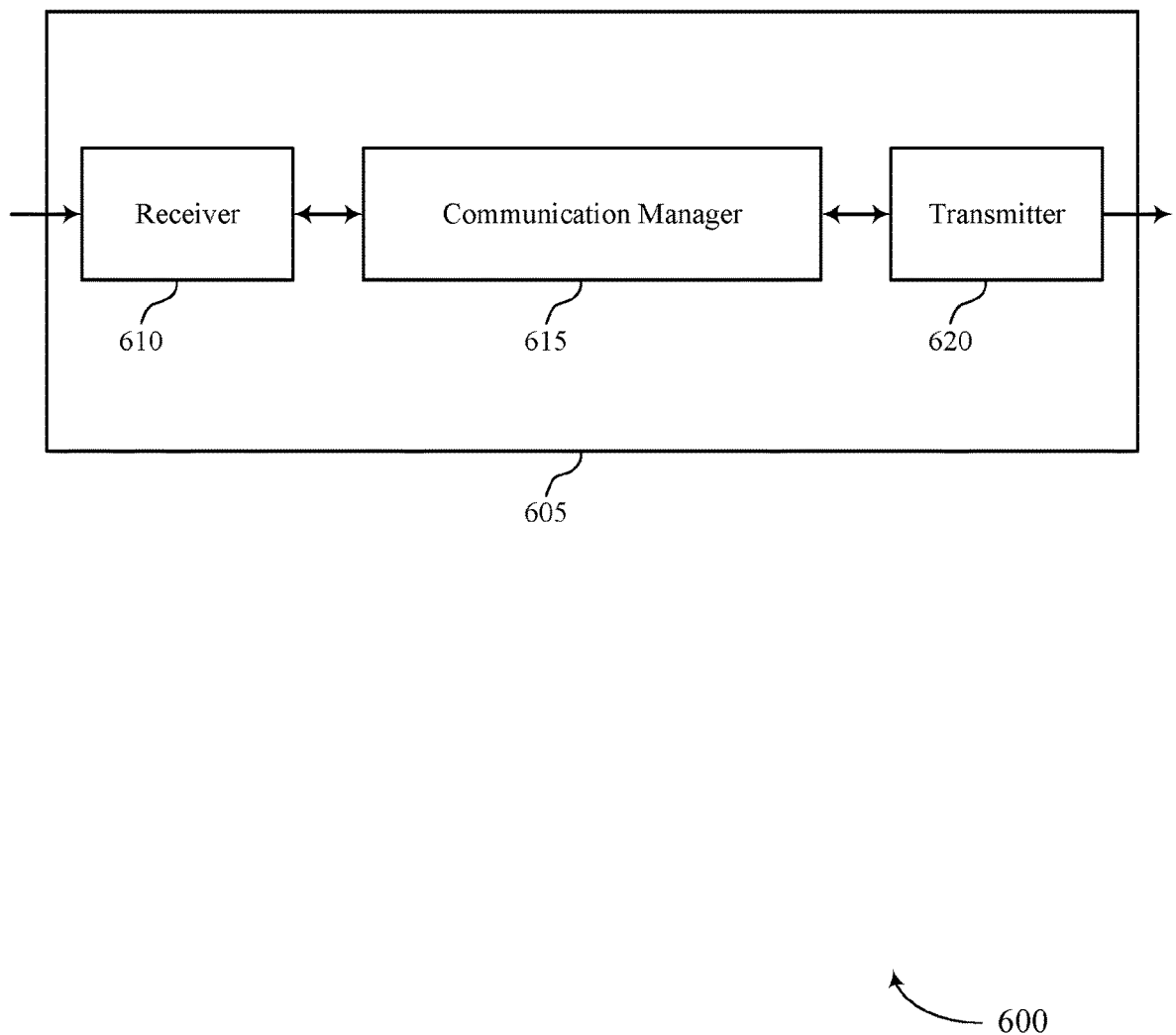
FIGS. 6 and 7 show block diagrams of devices that support low latency communication with carrier aggregation based fountain code operation in accordance with aspects of the present disclosure.

FIG. 6 shows a block diagram 600 of a device 605 that supports low latency communication with carrier aggregation based fountain code operation in accordance with aspects of the present disclosure. The device 605 may be an example of aspects of a UE 115 as described herein. The device 605 may include a receiver 610, a communication manager 615, and a transmitter 620. The device 605 may also include a processor. Each of these components may be in communication with one another (e.g., via one or more buses).

The receiver 610 may receive information such as packets, user data, or control information associated with various information channels (e.g., control channels, data channels, and information related to low latency communication with carrier aggregation based fountain code operation, etc.). Information may be passed on to other components of the device 605. The receiver 610 may be an example of aspects of the transceiver 915 described with reference to FIG. 9. The receiver 610 may utilize a single antenna or a set of antennas.

The communication manager 615 may divide one or more data units into a set of data blocks, encode the set of data blocks using a fountain code, generate a set of data units based on encoding the set of data blocks using the fountain code, allocate a first subset of the set of data units to a first carrier and a second subset of the set of data units to a second carrier, and transmit the first subset of the set of data units over the first carrier and the second subset of the set of data units over the second carrier. The communication manager 615 may be an example of aspects of the communication manager 910 described herein.

The communication manager 615, or its sub-components, may be implemented in hardware, code (e.g., software or firmware) executed by a processor, or any combination thereof. If implemented in code executed by a processor, the functions of the communication manager 615, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communication manager 615, or its sub-components, may be physically located at various positions, including being distributed such that portions of functions are implemented at different physical locations by one or more physical components. In some examples, the communication manager 615, or its sub-components, may be a separate and distinct component in accordance with various aspects of the present disclosure. In some examples, the communication manager 615, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 620 may transmit signals generated by other components of the device 605. In some examples, the transmitter 620 may be collocated with a receiver 610 in a transceiver component. For example, the transmitter 620 may be an example of aspects of the transceiver 915 described with reference to FIG. 9. The transmitter 620 may utilize a single antenna or a set of antennas.

Figure 7:
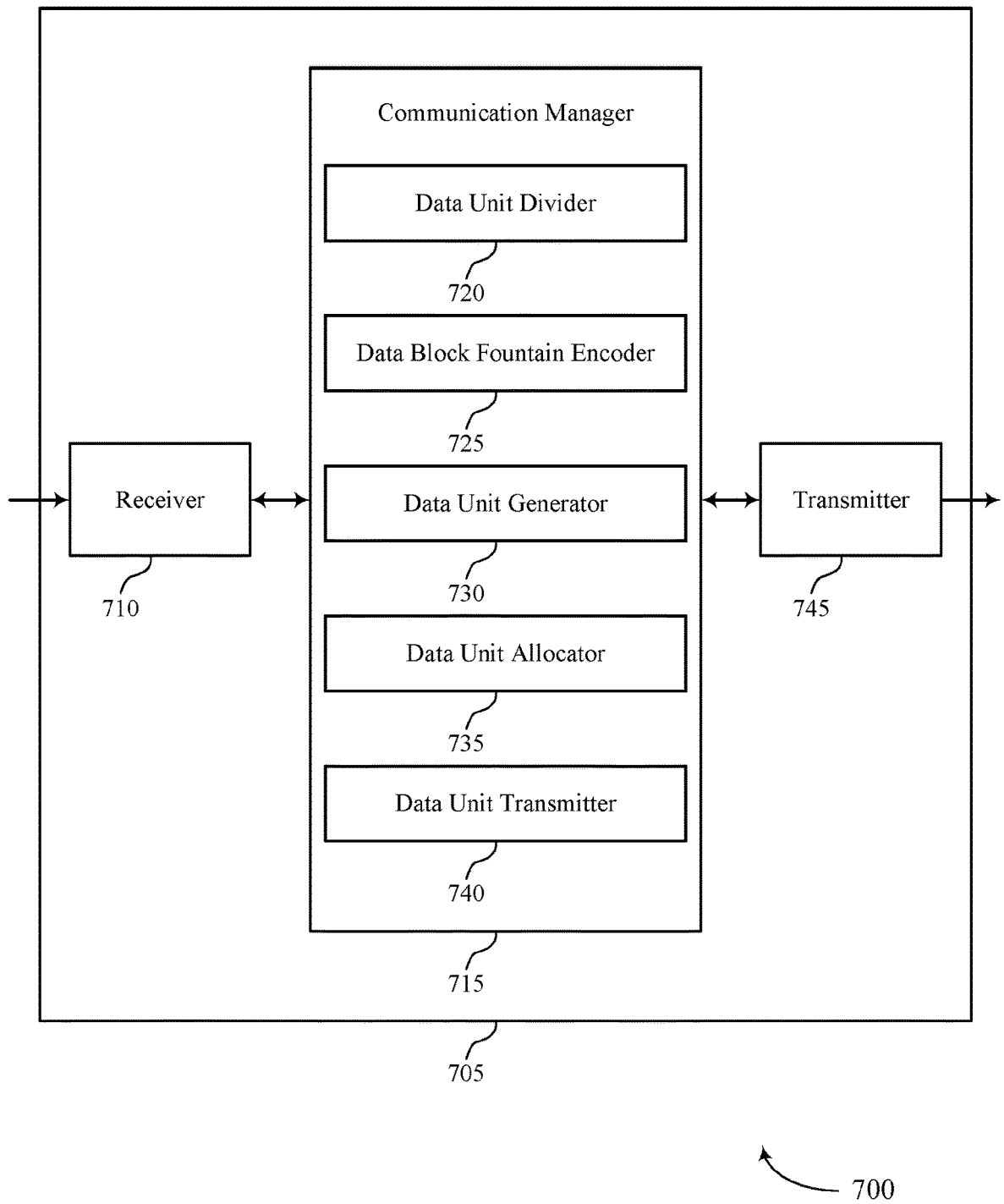

FIG. 7 shows a block diagram 700 of a device 705 that supports low latency communication with carrier aggregation based fountain code operation in accordance with aspects of the present disclosure. The device 705 may be an example of aspects of a device 605, or a UE 115 as described herein. The device 705 may include a receiver 710, a communication manager 715, and a transmitter 745. The device 705 may also include a processor. Each of these components may be in communication with one another (e.g., via one or more buses).

The receiver 710 may receive information such as packets, user data, or control information associated with various information channels (e.g., control channels, data channels, and information related to low latency communication with carrier aggregation based fountain code operation, etc.). Information may be passed on to other components of the device 705. The receiver 710 may be an example of aspects of the transceiver 915 described with reference to FIG. 9. The receiver 710 may utilize a single antenna or a set of antennas.

The communication manager 715 may be an example of aspects of the communication manager 615 as described herein. The communication manager 715 may include a data unit divider 720, a data block fountain encoder 725, a data unit generator 730, a data unit allocator 735, and a data unit transmitter 740. The communication manager 715 may be an example of aspects of the communication manager 910 described herein.

The data unit divider 720 may divide one or more data units into a set of data blocks.

The data block fountain encoder 725 may encode the set of data blocks using a fountain code.

The data unit generator 730 may generate a set of data units based on encoding the set of data blocks using the fountain code.

The data unit allocator 735 may allocate a first subset of the set of data units to a first carrier and a second subset of the set of data units to a second carrier.

The data unit transmitter 740 may transmit the first subset of the set of data units over the first carrier and the second subset of the set of data units over the second carrier.

The transmitter 745 may transmit signals generated by other components of the device 705. In some examples, the transmitter 745 may be collocated with a receiver 710 in a transceiver component. For example, the transmitter 745 may be an example of aspects of the transceiver 915 described with reference to FIG. 9. The transmitter 745 may utilize a single antenna or a set of antennas.

Figure 8:
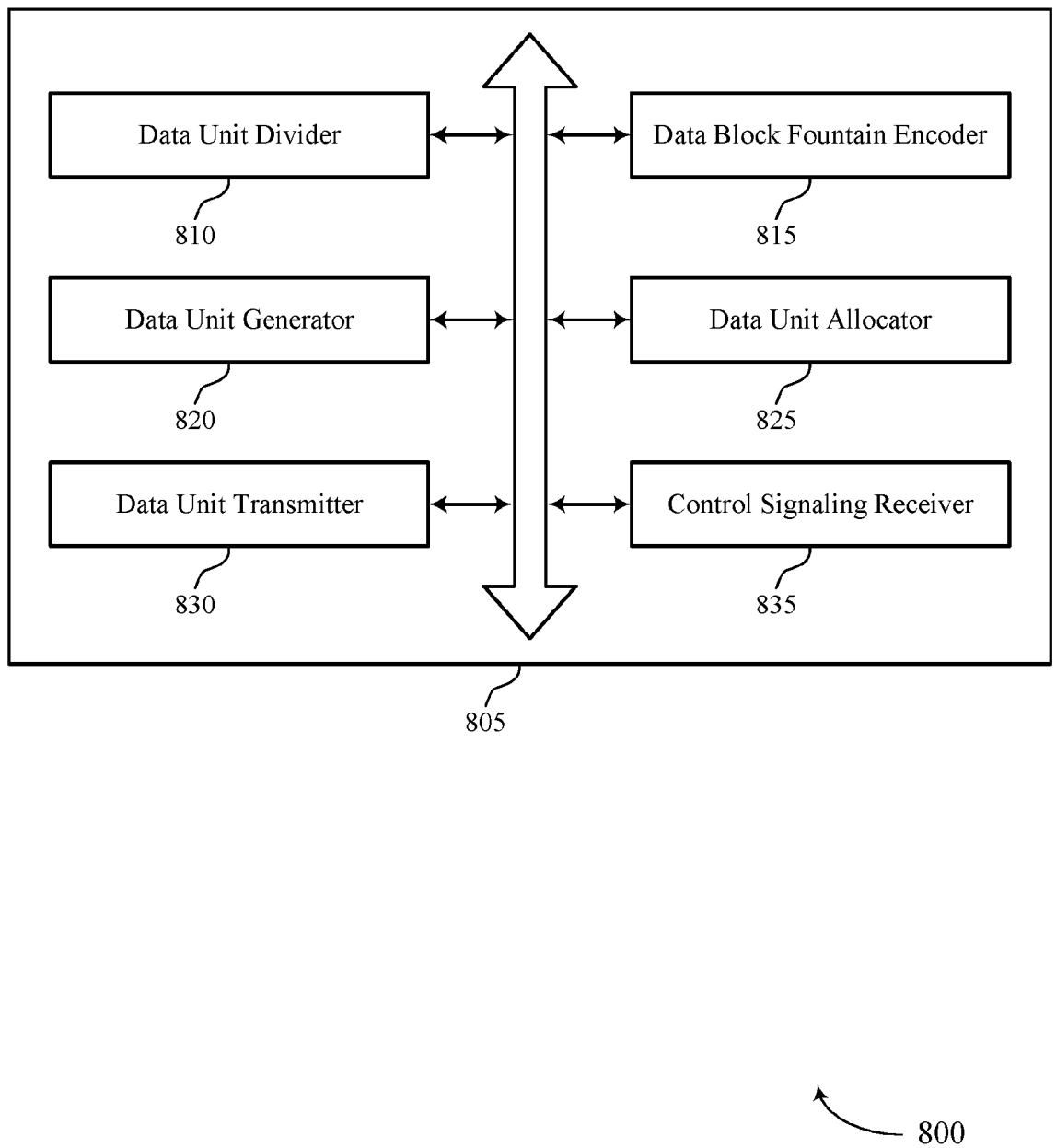
FIG. 8 shows a block diagram of a communication manager that supports low latency communication with carrier aggregation based fountain code operation in accordance with aspects of the present disclosure.

FIG. 8 shows a block diagram 800 of a communication manager 805 that supports low latency communication with carrier aggregation based fountain code operation in accordance with aspects of the present disclosure. The communication manager 805 may be an example of aspects of a communication manager 615, a communication manager 715, or a communication manager 910 described herein. The communication manager 805 may include a data unit divider 810, a data block fountain encoder 815, a data unit generator 820, a data unit allocator 825, a data unit transmitter 830, and a control signaling receiver 835. Each of these components may communicate, directly or indirectly, with one another (e.g., via one or more buses).

The data unit divider 810 may divide one or more data units into a set of data blocks. In some examples, concatenating each of the multiple data units, where dividing the one or more data units into the set of data blocks includes dividing the concatenated multiple data units into the set of data blocks. In some examples, the data unit divider 810 may determine that at least one of the multiple data units fails to satisfy a size threshold, where concatenating each of the multiple data units is based on determining that the at least one of the multiple data units fails to satisfy the size threshold.

The data block fountain encoder 815 may encode the set of data blocks using a fountain code.

The data unit generator 820 may generate a set of data units based on encoding the set of data blocks using the fountain code. In some examples, the data unit generator 820 may generate the set of data units based on receiving the indication of the generator matrix. In some examples, the data unit generator 820 may construct the generator matrix using the set of parameters, where generating the set of data units is based on constructing the generator matrix. In some examples, the data unit generator 820 may generate a set of packets based on encoding the set of data blocks using the fountain code. In some examples, the data unit generator 820 may map each of the set of packets to a respective data unit of the set of data units. In some examples, the data unit generator 820 may determine a channel condition of at least one of the first carrier or the second carrier. In some examples, the data unit generator 820 may determine a total quantity of data units for the set of data units based on determining the channel condition, where generating the set of data units is based on determining the total quantity of data units for the set of data units. In some cases, at least one data unit of the set of data units transmitted includes a header indicating whether the data unit was encoded using the fountain code. In some cases, the header includes a sequence number corresponding to the fountain code. In some cases, the header includes a second sequence number located immediately before the sequence number corresponding to the fountain code. In some cases, the header indicates that the data unit was encoded using the fountain code based on one or more bits of the header corresponding to an indication of whether the data unit includes data or control information, one or more bits corresponding to an indication of segment information for the data unit, one or more bits specific to indicating that the data unit was encoded using the fountain code, or any combination thereof.

The data unit allocator 825 may allocate a first subset of the set of data units to a first carrier and a second subset of the set of data units to a second carrier.

The data unit transmitter 830 may transmit the first subset of the set of data units over the first carrier and the second subset of the set of data units over the second carrier. In some examples, the data unit transmitter 830 may transmit the first subset of the set of data units containing a different total quantity of data units than the second subset of the set of data units. In some examples, comparing a channel condition of the first carrier with a channel condition of the second carrier, where the allocating includes allocating the first subset of the set of data units to the first carrier and the second subset of the set of data units to the second carrier such that the first subset of the set of data units contains a different total quantity of data units from the second subset of the set of data units based on comparing the channel condition of the first carrier with the channel condition of the second carrier. In some examples, determining that the first carrier has a higher link quality than the second carrier, where the allocating includes allocating the first subset of the set of data units to the first carrier and the second subset of the set of data units to the second carrier such that the first subset of the set of data units contains a greater quantity of total data units than the second subset of the set of data units based on determining that the first carrier has a higher link quality than the second carrier. In some examples, transmit a third subset of a second set of data units over the first carrier before transmitting the first subset of the set of data units, where the allocating includes allocating the first subset of the set of data units to the first carrier such that the first subset of the set of data units contains a different total quantity of data units than the third subset based on comparing the channel condition of the first carrier with the channel condition of the second carrier.

The control signaling receiver 835 may receive an indication of a total quantity of data blocks for the set of data blocks and an indication of a total quantity of data units for the set of data units, where dividing the one or more data units into the set of data blocks is based on the indicated total quantity of data blocks and where generating the set of data units is based on the indicated total quantity of data units. In some examples, the control signaling receiver 835 may transmit via radio resource control signaling. In some examples, the control signaling receiver 835 may receive an indication of a generator matrix corresponding to the fountain code. In some examples, the control signaling receiver 835 may receive a set of parameters to construct a generator matrix corresponding to a fountain code. In some examples, the control signaling receiver 835 may receive via radio resource control signaling.

Figure 9:
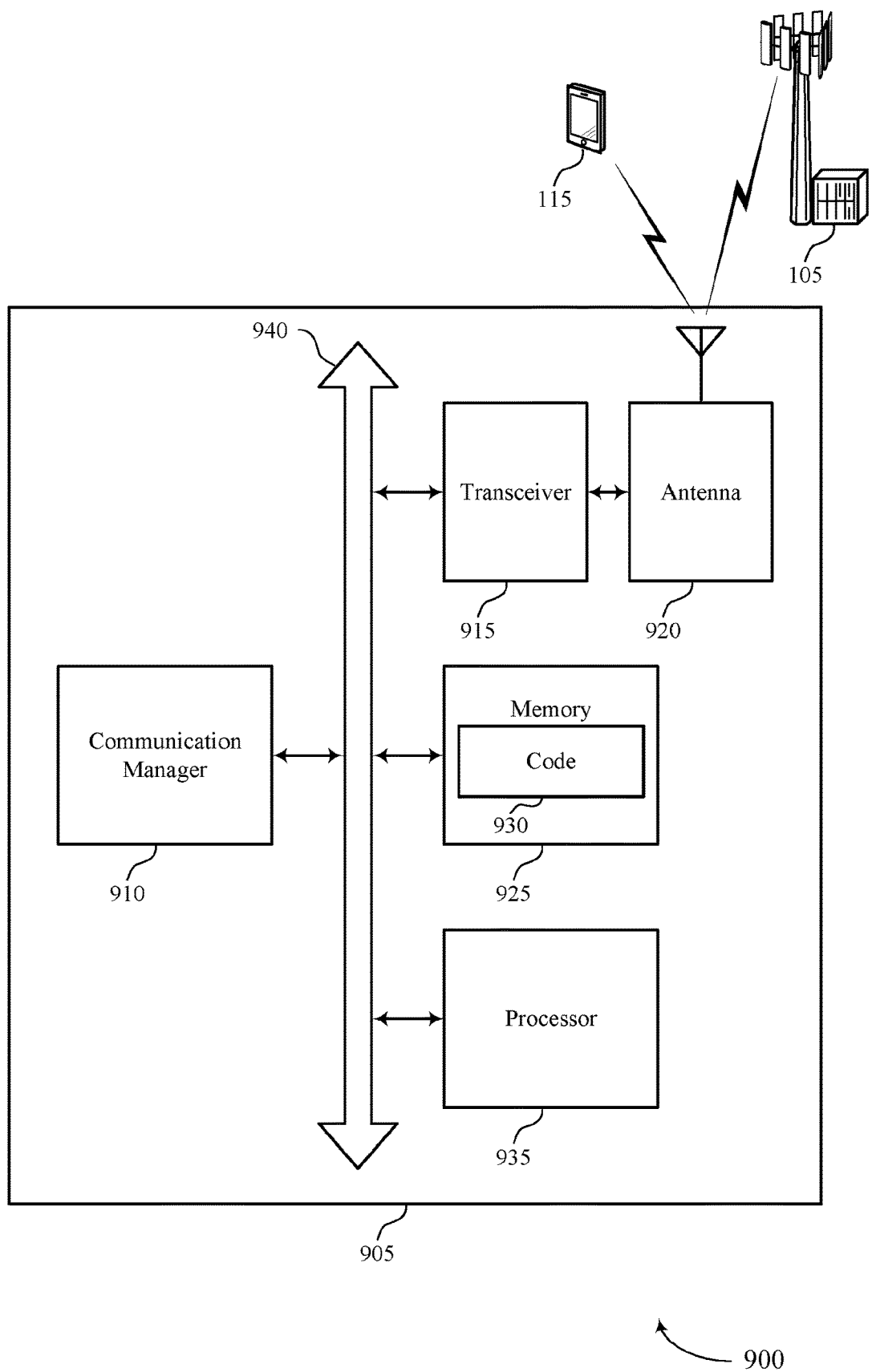
FIG. 9 shows a diagram of a system including a device that supports low latency communication with carrier aggregation based fountain code operation in accordance with aspects of the present disclosure.

FIG. 9 shows a diagram of a system 900 including a device 905 that supports low latency communication with carrier aggregation based fountain code operation in accordance with aspects of the present disclosure. The device 905 may be an example of or include the components of device 605, device 705, or a UE 115 as described herein. The device 905 may include components for bi-directional voice and data communications including components for transmitting and receiving communications, including a communication manager 910, a transceiver 915, an antenna 920, memory 925, and a processor 935. These components may be in electronic communication via one or more buses (e.g., bus 940).

The communication manager 910 may divide one or more data units into a set of data blocks, encode the set of data blocks using a fountain code, generate a set of data units based on encoding the set of data blocks using the fountain code, allocate a first subset of the set of data units to a first carrier and a second subset of the set of data units to a second carrier, and transmit the first subset of the set of data units over the first carrier and the second subset of the set of data units over the second carrier.

The transceiver 915 may communicate bi-directionally, via one or more antennas, wired, or wireless links as described above. For example, the transceiver 915 may represent a wireless transceiver and may communicate bi-directionally with another wireless transceiver. The transceiver 915 may also include a modem to modulate the packets and provide the modulated packets to the antennas for transmission, and to demodulate packets received from the antennas.

In some cases, the wireless device may include a single antenna 920. However, in some cases the device may have more than one antenna 920, which may be capable of concurrently transmitting or receiving multiple wireless transmissions.

The memory 925 may include random-access memory (RAM) and read-only memory (ROM). The memory 925 may store computer-readable, computer-executable code 930 including instructions that, when executed, cause the processor to perform various functions described herein. In some cases, the memory 925 may contain, among other things, a basic input/output system (BIOS) which may control basic hardware or software operation such as the interaction with peripheral components or devices.

The code 930 may include instructions to implement aspects of the present disclosure, including instructions to support wireless communications. The code 930 may be stored in a non-transitory computer-readable medium such as system memory or other type of memory. In some cases, the code 930 may not be directly executable by the processor 935 but may cause a computer (e.g., when compiled and executed) to perform functions described herein.

The processor 935 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 935 may be configured to operate a memory array using a memory controller. In other cases, a memory controller may be integrated into the processor 935. The processor 935 may be configured to execute computer-readable instructions stored in a memory (e.g., the memory 925) to cause the device 905 to perform various functions (e.g., functions or tasks supporting low latency communication with carrier aggregation based fountain code operation).

Figure 10:
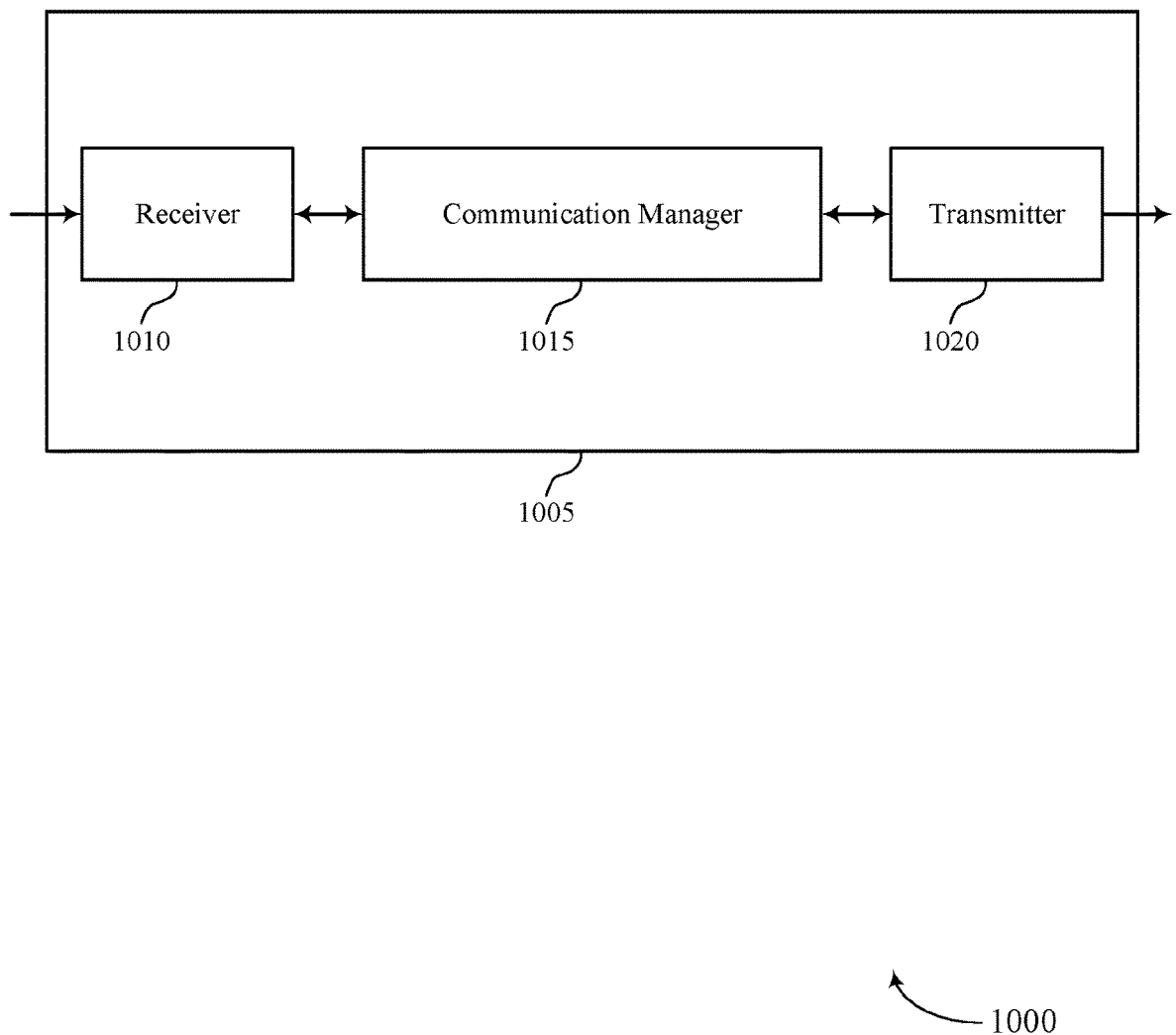
FIGS. 10 and 11 show block diagrams of devices that support low latency communication with carrier aggregation based fountain code operation in accordance with aspects of the present disclosure.

FIG. 10 shows a block diagram 1000 of a device 1005 that supports low latency communication with carrier aggregation based fountain code operation in accordance with aspects of the present disclosure. The device 1005 may be an example of aspects of a base station 105 as described herein. The device 1005 may include a receiver 1010, a communication manager 1015, and a transmitter 1020. The device 1005 may also include a processor. Each of these components may be in communication with one another (e.g., via one or more buses).

The receiver 1010 may receive information such as packets, user data, or control information associated with various information channels (e.g., control channels, data channels, and information related to low latency communication with carrier aggregation based fountain code operation, etc.). Information may be passed on to other components of the device 1005. The receiver 1010 may be an example of aspects of the transceiver 1320 described with reference to FIG. 13. The receiver 1010 may utilize a single antenna or a set of antennas.

The communication manager 1015 may receive a first set of data units over a first carrier and a second set of data units over a second carrier, construct, based on the first set of data units and the second set of data units, a generator matrix associated with a fountain code, determine a set of data blocks based on identifying the generator matrix associated with the fountain code, and aggregate the set of data blocks into one or more data units. The communication manager 1015 may be an example of aspects of the communication manager 1310 described herein.

The communication manager 1015, or its sub-components, may be implemented in hardware, code (e.g., software or firmware) executed by a processor, or any combination thereof. If implemented in code executed by a processor, the functions of the communication manager 1015, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The communication manager 1015, or its sub-components, may be physically located at various positions, including being distributed such that portions of functions are implemented at different physical locations by one or more physical components. In some examples, the communication manager 1015, or its sub-components, may be a separate and distinct component in accordance with various aspects of the present disclosure. In some examples, the communication manager 1015, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 1020 may transmit signals generated by other components of the device 1005. In some examples, the transmitter 1020 may be collocated with a receiver 1010 in a transceiver component. For example, the transmitter 1020 may be an example of aspects of the transceiver 1320 described with reference to FIG. 13. The transmitter 1020 may utilize a single antenna or a set of antennas.

Figure 11:
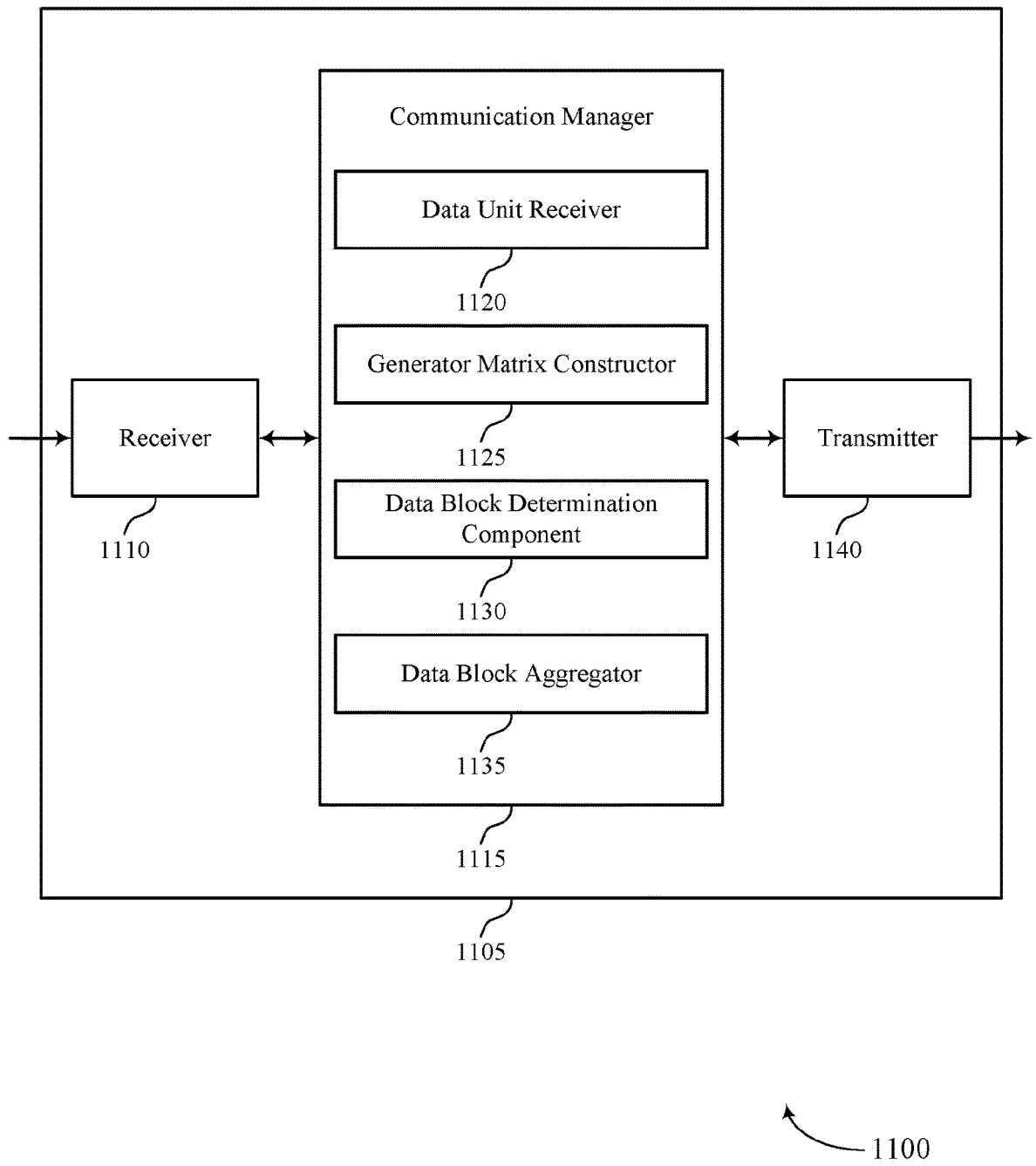

FIG. 11 shows a block diagram 1100 of a device 1105 that supports low latency communication with carrier aggregation based fountain code operation in accordance with aspects of the present disclosure. The device 1105 may be an example of aspects of a device 1005, or a base station 105 as described herein. The device 1105 may include a receiver 1110, a communication manager 1115, and a transmitter 1140. The device 1105 may also include a processor. Each of these components may be in communication with one another (e.g., via one or more buses).

The receiver 1110 may receive information such as packets, user data, or control information associated with various information channels (e.g., control channels, data channels, and information related to low latency communication with carrier aggregation based fountain code operation, etc.). Information may be passed on to other components of the device 1105. The receiver 1110 may be an example of aspects of the transceiver 1320 described with reference to FIG. 13. The receiver 1110 may utilize a single antenna or a set of antennas.

The communication manager 1115 may be an example of aspects of the communication manager 1015 as described herein. The communication manager 1115 may include a data unit receiver 1120, a generator matrix constructor 1125, a data block determination component 1130, and a data block aggregator 1135. The communication manager 1115 may be an example of aspects of the communication manager 1310 described herein.

The data unit receiver 1120 may receive a first set of data units over a first carrier and a second set of data units over a second carrier.

The generator matrix constructor 1125 may construct, based on the first set of data units and the second set of data units, a generator matrix associated with a fountain code.

The data block determination component 1130 may determine a set of data blocks based on identifying the generator matrix associated with the fountain code.

The data block aggregator 1135 may aggregate the set of data blocks into one or more data units.

The transmitter 1140 may transmit signals generated by other components of the device 1105. In some examples, the transmitter 1140 may be collocated with a receiver 1110 in a transceiver component. For example, the transmitter 1140 may be an example of aspects of the transceiver 1320 described with reference to FIG. 13. The transmitter 1140 may utilize a single antenna or a set of antennas.

Figure 12:
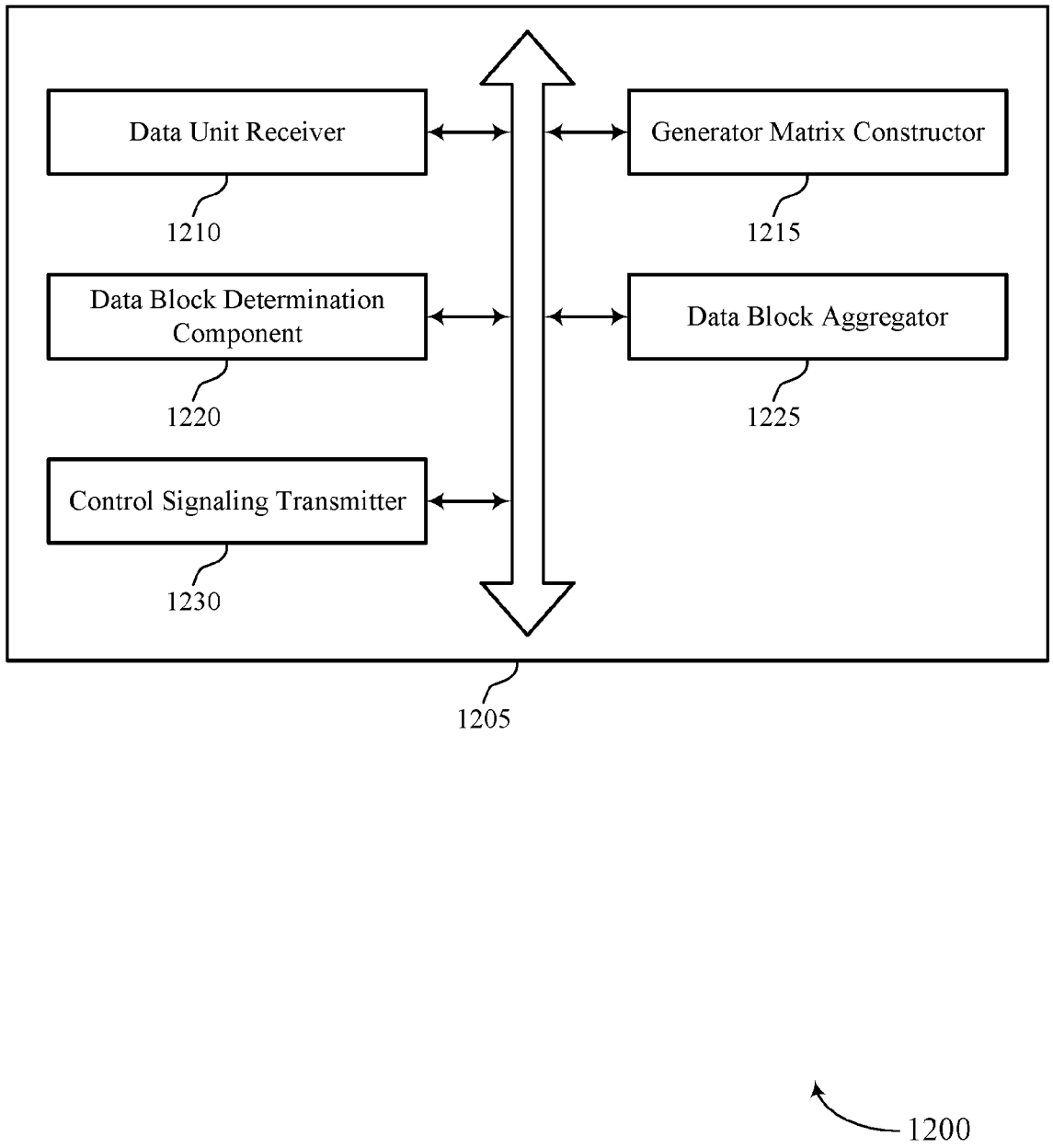
FIG. 12 shows a block diagram of a communication manager that supports low latency communication with carrier aggregation based fountain code operation in accordance with aspects of the present disclosure.

FIG. 12 shows a block diagram 1200 of a communication manager 1205 that supports low latency communication with carrier aggregation based fountain code operation in accordance with aspects of the present disclosure. The communication manager 1205 may be an example of aspects of a communication manager 1015, a communication manager 1115, or a communication manager 1310 described herein. The communication manager 1205 may include a data unit receiver 1210, a generator matrix constructor 1215, a data block determination component 1220, a data block aggregator 1225, and a control signaling transmitter 1230. Each of these components may communicate, directly or indirectly, with one another (e.g., via one or more buses).

The data unit receiver 1210 may receive a first set of data units over a first carrier and a second set of data units over a second carrier. In some examples, the data unit receiver 1210 may receive the first set of data units including a different total quantity of data units than the second set of data units. In some examples, the data unit receiver 1210 may receive the first set of data units including a different total quantity of data units than the second set of data units when a channel condition of the first carrier is different than a channel condition of the second carrier. In some examples, the data unit receiver 1210 may receive the first set of data units containing a greater total quantity of data units than the second carrier when the first carrier has a higher link quality than the second carrier. In some examples, the data unit receiver 1210 may receive a third set of data units on the first carrier before receiving the first set of data units, where a total quantity of data units of the third set of data units is different than a total quantity of data units of the first set of data units when a channel condition associated with the first carrier while receiving the third set of data units is different than a channel condition associated with the first carrier while receiving the first set of data units. In some cases, at least one data unit of the first set or the second set includes a header indicating whether the data unit was encoded using the fountain code. In some cases, the header includes a sequence number corresponding to the fountain code. In some cases, the header includes a second sequence number located immediately before the sequence number corresponding to the fountain code. In some cases, the header indicates that the data unit was encoded using the fountain code based on one or more bits of the header corresponding to an indication of whether the data unit includes data or control information, one or more bits corresponding to an indication of segment information for the data unit, one or more bits specific to indicating that the data unit was encoded using the fountain code, or any combination thereof.

The generator matrix constructor 1215 may construct, based on the first set of data units and the second set of data units, a generator matrix associated with a fountain code.

The data block determination component 1220 may determine a set of data blocks based on identifying the generator matrix associated with the fountain code. In some examples, the data block determination component 1220 may determine that a combined total quantity of data units in the first set of data units and the second set of data units satisfies a quantity threshold, where determining the set of data blocks is based on the combined total quantity of data units satisfying the quantity threshold. In some examples, the data block determination component 1220 may determine that the combined total quantity of data units is greater than a total quantity of data blocks of the set of data blocks. In some examples, the data block determination component 1220 may aggregate the first set of data units and the second set of data units into a set of data units, where the first set of data units is a first subset of the set of data units and the second set of data units is a second subset of the set of data units, and where determining the set of data blocks is based on the set of data units. In some examples, the data block determination component 1220 may map each of the set of data units to a respective packet of a set of packets, where determining the set of data blocks is based on mapping each of the set of data units to the respective packet of the set of packets.

The data block aggregator 1225 may aggregate the set of data blocks into one or more data units.

The control signaling transmitter 1230 may transmit an indication of a total quantity of data blocks of the set of data blocks, an indication of a total quantity of data units of a set of data units, or both. In some examples, the control signaling transmitter 1230 may transmit via radio resource control signaling. In some examples, the control signaling transmitter 1230 may transmit an indication of a mother generator matrix corresponding to the generator matrix. In some examples, the control signaling transmitter 1230 may transmit a set of parameters to construct a mother generator matrix. In some examples, the control signaling transmitter 1230 may transmit via radio resource control signaling.

Figure 13:
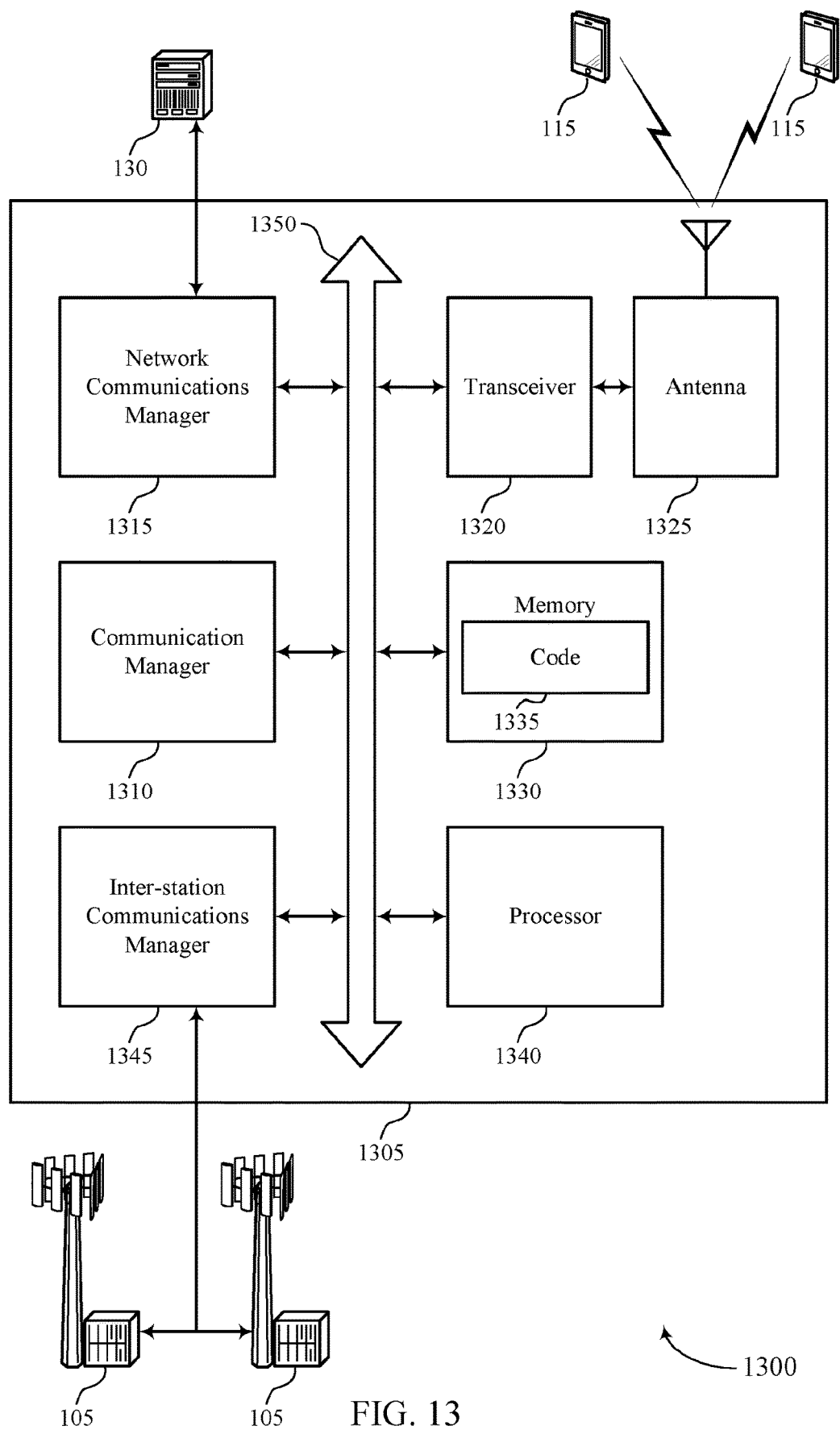
FIG. 13 shows a diagram of a system including a device that supports low latency communication with carrier aggregation based fountain code operation in accordance with aspects of the present disclosure.

FIG. 13 shows a diagram of a system 1300 including a device 1305 that supports low latency communication with carrier aggregation based fountain code operation in accordance with aspects of the present disclosure. The device 1305 may be an example of or include the components of device 1005, device 1105, or a base station 105 as described herein. The device 1305 may include components for bi-directional voice and data communications including components for transmitting and receiving communications, including a communication manager 1310, a network communications manager 1315, a transceiver 1320, an antenna 1325, memory 1330, a processor 1340, and an inter-station communications manager 1345. These components may be in electronic communication via one or more buses (e.g., bus 1350).

The communication manager 1310 may receive a first set of data units over a first carrier and a second set of data units over a second carrier, construct, based on the first set of data units and the second set of data units, a generator matrix associated with a fountain code, determine a set of data blocks based on identifying the generator matrix associated with the fountain code, and aggregate the set of data blocks into one or more data units.

The network communications manager 1315 may manage communications with the core network (e.g., via one or more wired backhaul links). For example, the network communications manager 1315 may manage the transfer of data communications for client devices, such as one or more UEs 115.

The transceiver 1320 may communicate bi-directionally, via one or more antennas, wired, or wireless links as described above. For example, the transceiver 1320 may represent a wireless transceiver and may communicate bi-directionally with another wireless transceiver. The transceiver 1320 may also include a modem to modulate the packets and provide the modulated packets to the antennas for transmission, and to demodulate packets received from the antennas.

In some cases, the wireless device may include a single antenna 1325. However, in some cases the device may have more than one antenna 1325, which may be capable of concurrently transmitting or receiving multiple wireless transmissions.

The memory 1330 may include RAM and ROM. The memory 1330 may store computer-readable, computer-executable code 1335 including instructions that, when executed, cause the processor to perform various functions described herein. In some cases, the memory 1330 may contain, among other things, a BIOS which may control basic hardware or software operation such as the interaction with peripheral components or devices.

The code 1335 may include instructions to implement aspects of the present disclosure, including instructions to support wireless communications. The code 1335 may be stored in a non-transitory computer-readable medium such as system memory or other type of memory. In some cases, the code 1335 may not be directly executable by the processor 1340 but may cause a computer (e.g., when compiled and executed) to perform functions described herein.

The processor 1340 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting low latency communication with carrier aggregation based fountain code operation).

The inter-station communications manager 1345 may manage communications with other base station 105, and may include a controller or scheduler for controlling communications with UEs 115 in cooperation with other base stations 105. For example, the inter-station communications manager 1345 may coordinate scheduling for transmissions to UEs 115 for various interference mitigation techniques such as beamforming or joint transmission. In some examples, the inter-station communications manager 1345 may provide an X2 interface within an LTE/LTE-A wireless communication network technology to provide communication between base stations 105.

Figure 14:
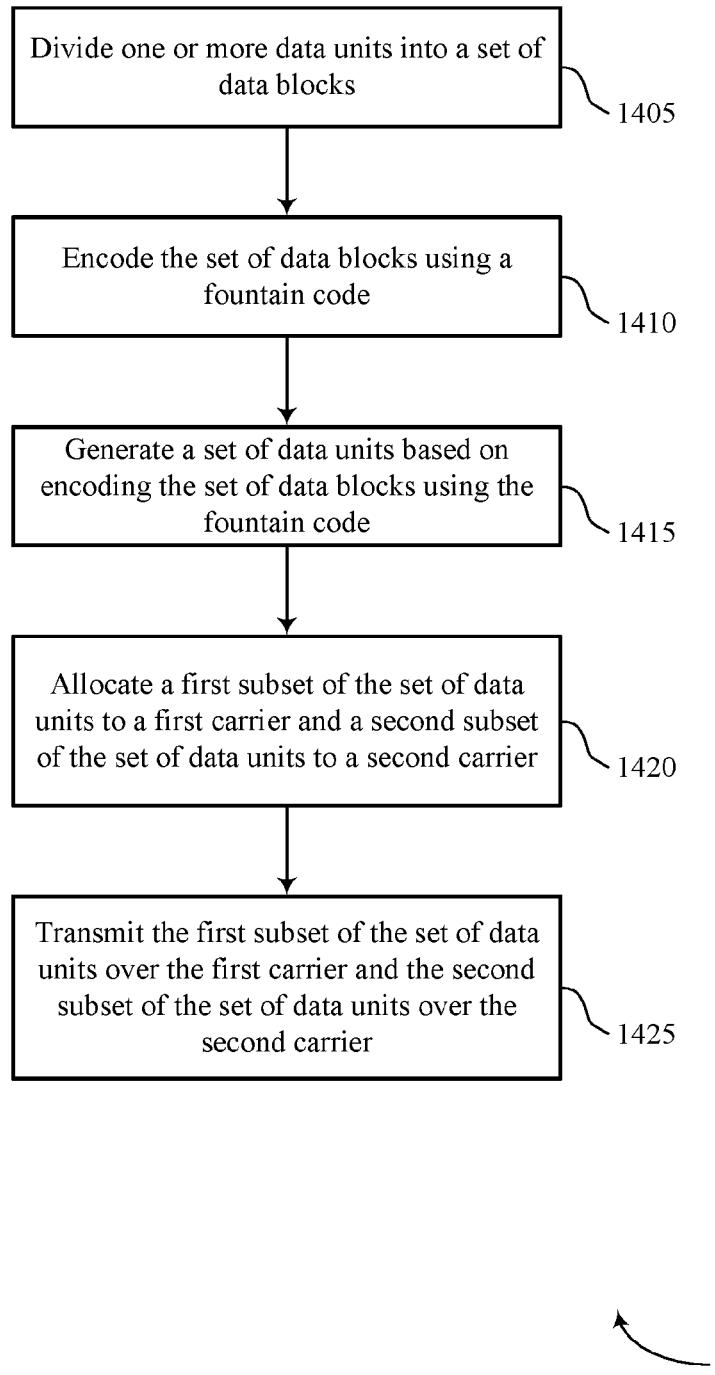
FIGS. 14 through 21 show flowcharts illustrating methods that support low latency communication with carrier aggregation based fountain code operation in accordance with aspects of the present disclosure.

FIG. 14 shows a flowchart illustrating a method 1400 that supports low latency communication with carrier aggregation based fountain code operation in accordance with aspects of the present disclosure. The operations of method 1400 may be implemented by a UE 115 or its components as described herein. For example, the operations of method 1400 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1405, the UE may divide one or more data units into a set of data blocks. The operations of 1405 may be performed according to the methods described herein. In some examples, aspects of the operations of 1405 may be performed by a data unit divider as described with reference to FIGS. 6 through 9.

At 1410, the UE may encode the set of data blocks using a fountain code. The operations of 1410 may be performed according to the methods described herein. In some examples, aspects of the operations of 1410 may be performed by a data block fountain encoder as described with reference to FIGS. 6 through 9.

At 1415, the UE may generate a set of data units based on encoding the set of data blocks using the fountain code. The operations of 1415 may be performed according to the methods described herein. In some examples, aspects of the operations of 1415 may be performed by a data unit generator as described with reference to FIGS. 6 through 9.

At 1420, the UE may allocate a first subset of the set of data units to a first carrier and a second subset of the set of data units to a second carrier. The operations of 1420 may be performed according to the methods described herein. In some examples, aspects of the operations of 1420 may be performed by a data unit allocator as described with reference to FIGS. 6 through 9.

At 1425, the UE may transmit the first subset of the set of data units over the first carrier and the second subset of the set of data units over the second carrier. The operations of 1425 may be performed according to the methods described herein. In some examples, aspects of the operations of 1425 may be performed by a data unit transmitter as described with reference to FIGS. 6 through 9.

Figure 15:
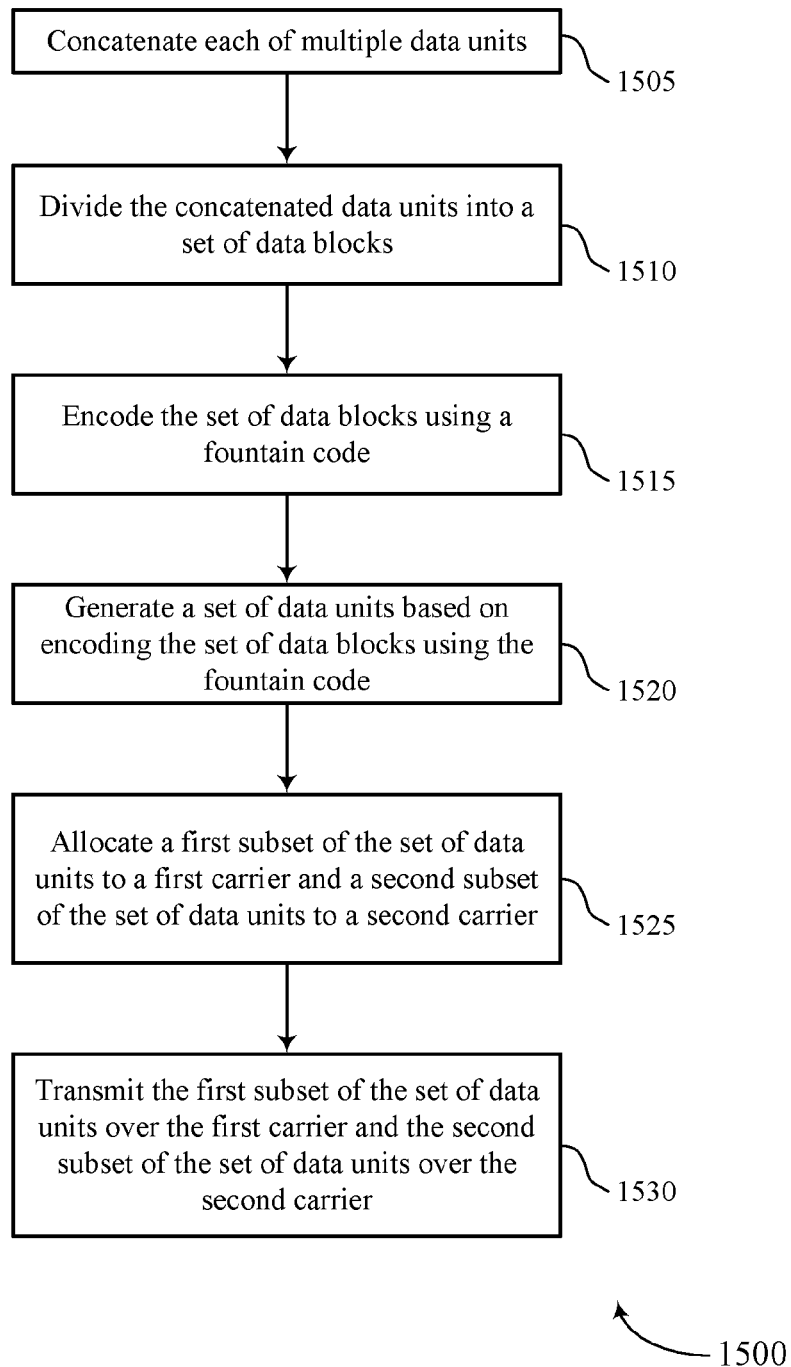

FIG. 15 shows a flowchart illustrating a method 1500 that supports low latency communication with carrier aggregation based fountain code operation in accordance with aspects of the present disclosure. The operations of method 1500 may be implemented by a UE 115 or its components as described herein. For example, the operations of method 1500 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1505, the UE may concatenate each of multiple data units. The operations of 1505 may be performed according to the methods described herein. In some examples, aspects of the operations of 1505 may be performed by a data unit divider as described with reference to FIGS. 6 through 9.

At 1510, the UE may divide the concatenated data units into a set of data blocks. The operations of 1510 may be performed according to the methods described herein. In some examples, aspects of the operations of 1510 may be performed by a data unit divider as described with reference to FIGS. 6 through 9.

At 1515, the UE may encode the set of data blocks using a fountain code. The operations of 1515 may be performed according to the methods described herein. In some examples, aspects of the operations of 1515 may be performed by a data block fountain encoder as described with reference to FIGS. 6 through 9.

At 1520, the UE may generate a set of data units based on encoding the set of data blocks using the fountain code. The operations of 1520 may be performed according to the methods described herein. In some examples, aspects of the operations of 1520 may be performed by a data unit generator as described with reference to FIGS. 6 through 9.

At 1525, the UE may allocate a first subset of the set of data units to a first carrier and a second subset of the set of data units to a second carrier. The operations of 1525 may be performed according to the methods described herein. In some examples, aspects of the operations of 1525 may be performed by a data unit allocator as described with reference to FIGS. 6 through 9.

At 1530, the UE may transmit the first subset of the set of data units over the first carrier and the second subset of the set of data units over the second carrier. The operations of 1530 may be performed according to the methods described herein. In some examples, aspects of the operations of 1530 may be performed by a data unit transmitter as described with reference to FIGS. 6 through 9.

Figure 16:
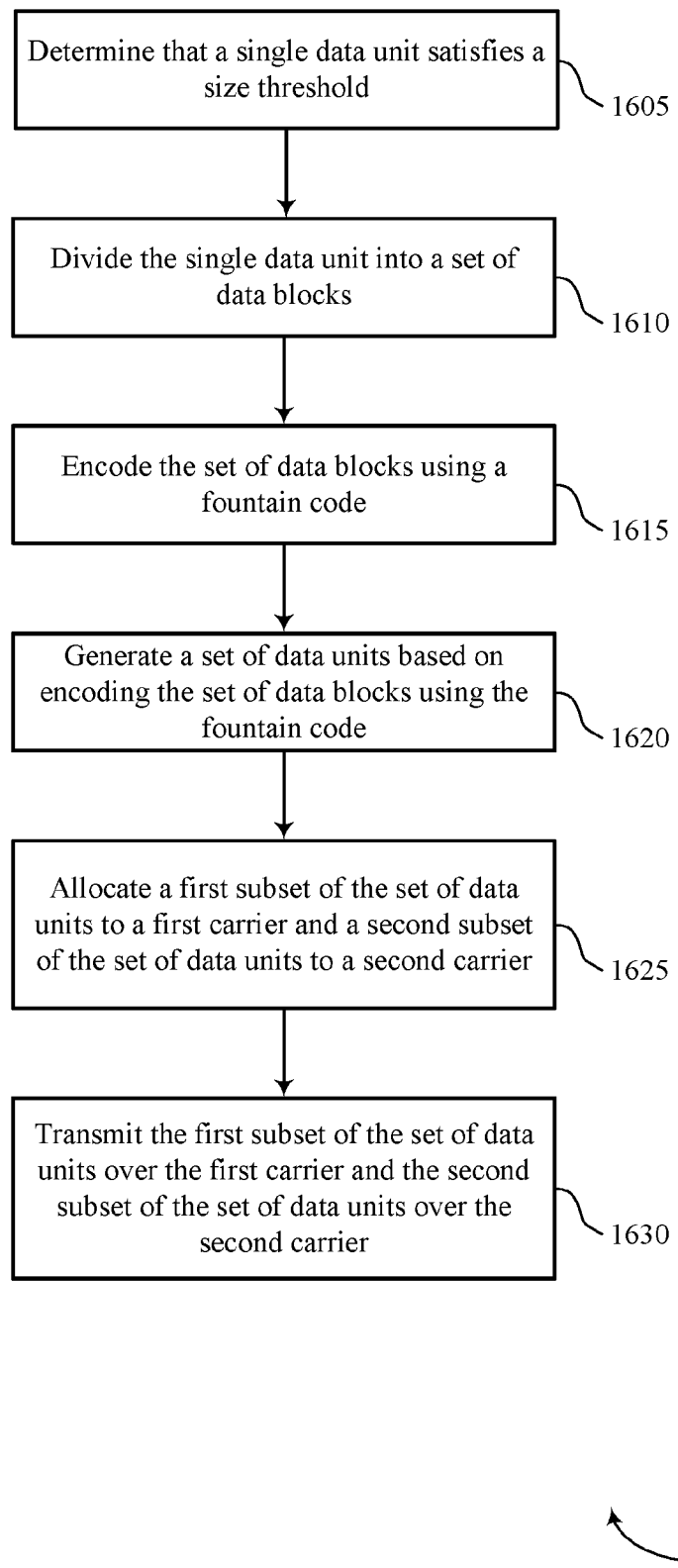

FIG. 16 shows a flowchart illustrating a method 1600 that supports low latency communication with carrier aggregation based fountain code operation in accordance with aspects of the present disclosure. The operations of method 1600 may be implemented by a UE 115 or its components as described herein. For example, the operations of method 1600 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1605, the UE may determine that a single data unit satisfies a size threshold. The operations of 1605 may be performed according to the methods described herein. In some examples, aspects of the operations of 1605 may be performed by a data unit divider as described with reference to FIGS. 6 through 9.

At 1610, the UE may divide one or more data units into a set of data blocks. The operations of 1610 may be performed according to the methods described herein. In some examples, aspects of the operations of 1610 may be performed by a data unit divider as described with reference to FIGS. 6 through 9.

At 1615, the UE may encode the set of data blocks using a fountain code. The operations of 1615 may be performed according to the methods described herein. In some examples, aspects of the operations of 1615 may be performed by a data block fountain encoder as described with reference to FIGS. 6 through 9.

At 1620, the UE may generate a set of data units based on encoding the set of data blocks using the fountain code. The operations of 1620 may be performed according to the methods described herein. In some examples, aspects of the operations of 1620 may be performed by a data unit generator as described with reference to FIGS. 6 through 9.

At 1625, the UE may allocate a first subset of the set of data units to a first carrier and a second subset of the set of data units to a second carrier. The operations of 1625 may be performed according to the methods described herein. In some examples, aspects of the operations of 1625 may be performed by a data unit allocator as described with reference to FIGS. 6 through 9.

At 1630, the UE may transmit the first subset of the set of data units over the first carrier and the second subset of the set of data units over the second carrier. The operations of 1630 may be performed according to the methods described herein. In some examples, aspects of the operations of 1630 may be performed by a data unit transmitter as described with reference to FIGS. 6 through 9.

Figure 17:
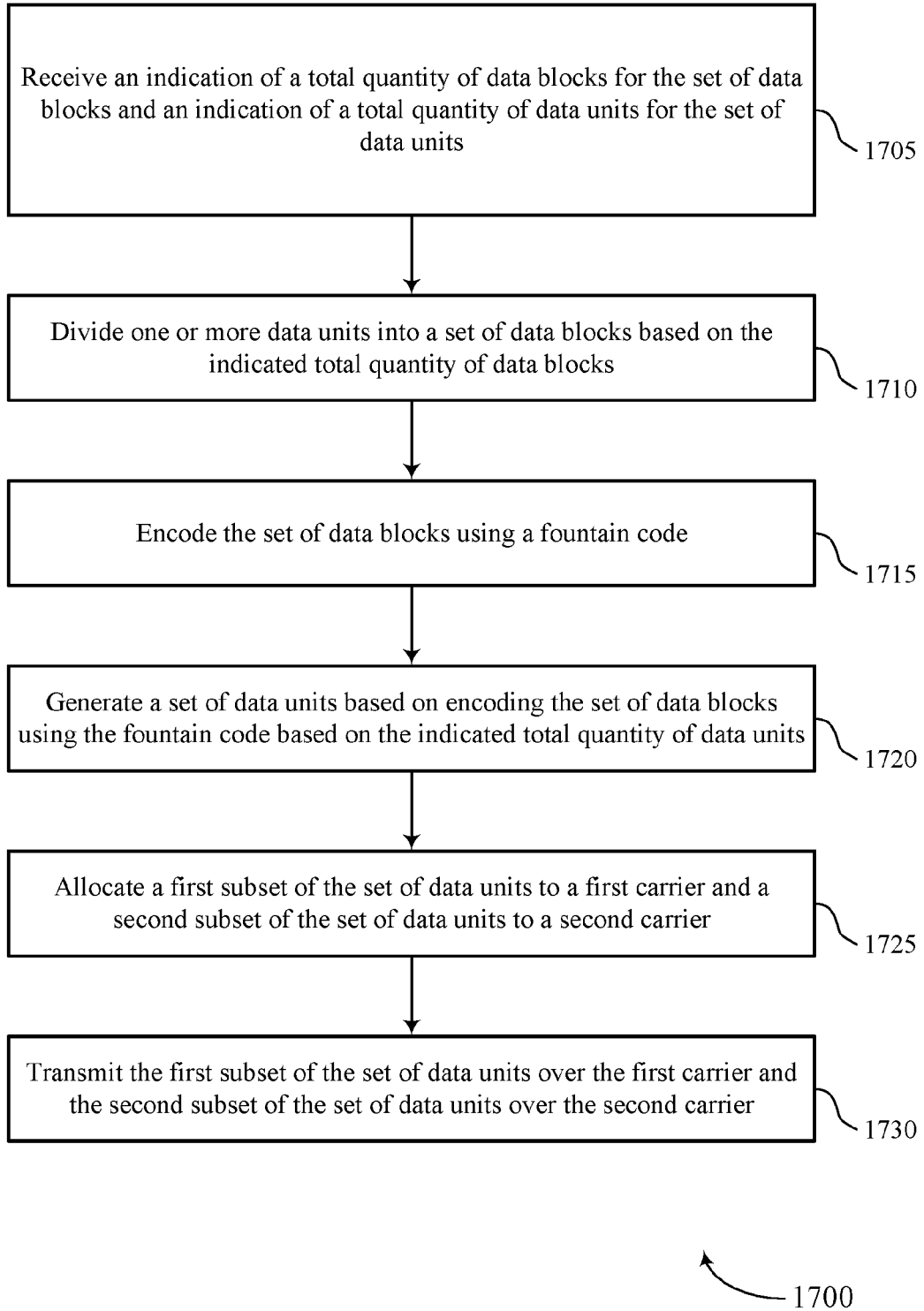

FIG. 17 shows a flowchart illustrating a method 1700 that supports low latency communication with carrier aggregation based fountain code operation in accordance with aspects of the present disclosure. The operations of method 1700 may be implemented by a UE 115 or its components as described herein. For example, the operations of method 1700 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1705, the UE may receive an indication of a total quantity of data blocks for the set of data blocks and an indication of a total quantity of data units for the set of data units. The operations of 1705 may be performed according to the methods described herein. In some examples, aspects of the operations of 1705 may be performed by a control signaling receiver as described with reference to FIGS. 6 through 9.

At 1710, the UE may divide one or more data units into a set of data blocks based on the indicated total quantity of data blocks. The operations of 1710 may be performed according to the methods described herein. In some examples, aspects of the operations of 1710 may be performed by a data unit divider as described with reference to FIGS. 6 through 9.

At 1715, the UE may encode the set of data blocks using a fountain code. The operations of 1715 may be performed according to the methods described herein. In some examples, aspects of the operations of 1715 may be performed by a data block fountain encoder as described with reference to FIGS. 6 through 9.

At 1720, the UE may generate a set of data units based on encoding the set of data blocks using the fountain code based on the indicated total quantity of data units. The operations of 1720 may be performed according to the methods described herein. In some examples, aspects of the operations of 1720 may be performed by a data unit generator as described with reference to FIGS. 6 through 9.

At 1725, the UE may allocate a first subset of the set of data units to a first carrier and a second subset of the set of data units to a second carrier. The operations of 1725 may be performed according to the methods described herein. In some examples, aspects of the operations of 1725 may be performed by a data unit allocator as described with reference to FIGS. 6 through 9.

At 1730, the UE may transmit the first subset of the set of data units over the first carrier and the second subset of the set of data units over the second carrier. The operations of 1730 may be performed according to the methods described herein. In some examples, aspects of the operations of 1730 may be performed by a data unit transmitter as described with reference to FIGS. 6 through 9.

Figure 18:
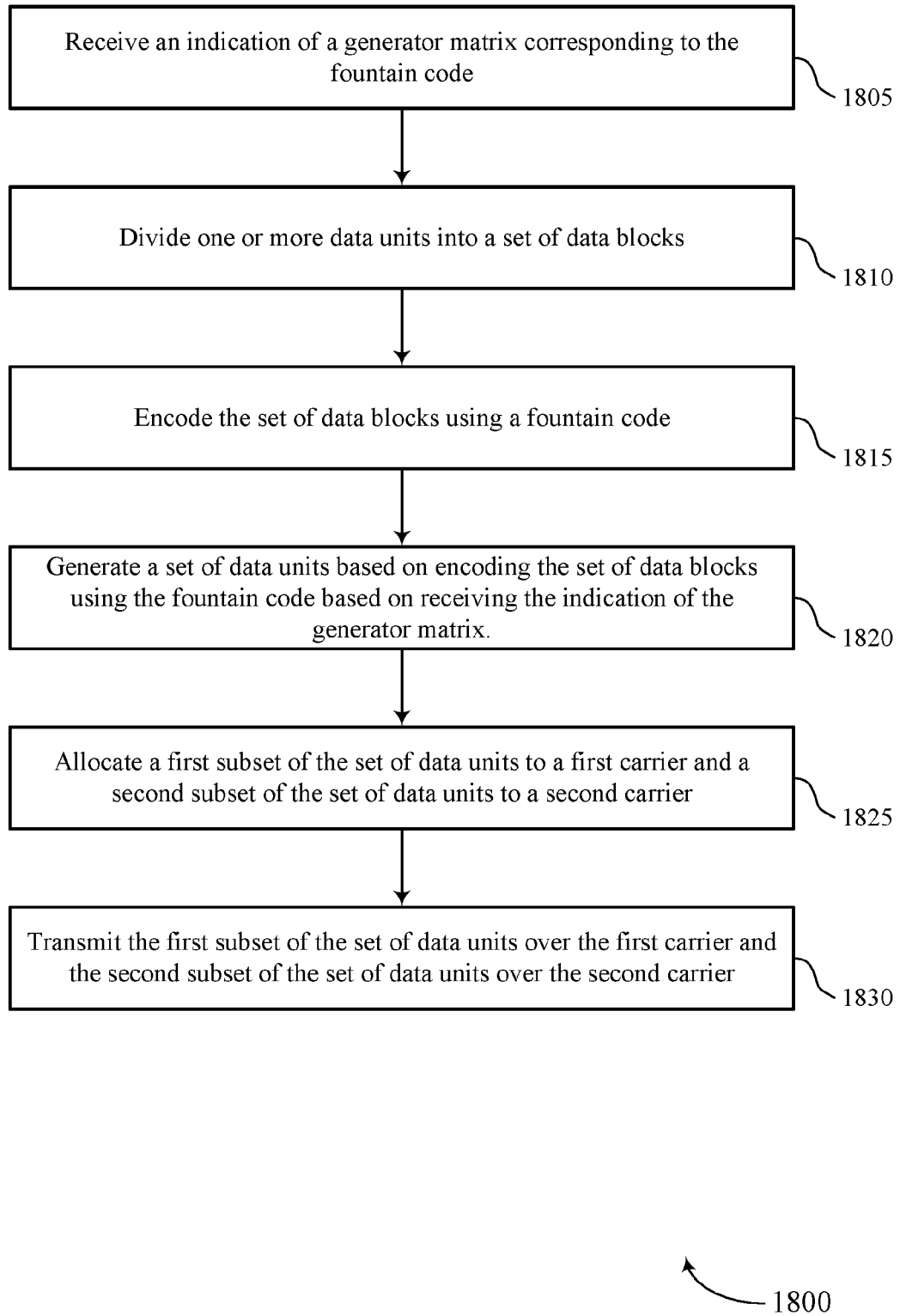

FIG. 18 shows a flowchart illustrating a method 1800 that supports low latency communication with carrier aggregation based fountain code operation in accordance with aspects of the present disclosure. The operations of method 1800 may be implemented by a UE 115 or its components as described herein. For example, the operations of method 1800 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1805, the UE may receive an indication of a generator matrix corresponding to the fountain code. The operations of 1805 may be performed according to the methods described herein. In some examples, aspects of the operations of 1805 may be performed by a control signaling receiver as described with reference to FIGS. 6 through 9.

At 1810, the UE may divide one or more data units into a set of data blocks. The operations of 1810 may be performed according to the methods described herein. In some examples, aspects of the operations of 1810 may be performed by a data unit divider as described with reference to FIGS. 6 through 9.

At 1815, the UE may encode the set of data blocks using a fountain code. The operations of 1815 may be performed according to the methods described herein. In some examples, aspects of the operations of 1815 may be performed by a data block fountain encoder as described with reference to FIGS. 6 through 9.

At 1820, the UE may generate a set of data units based on encoding the set of data blocks using the fountain code based on receiving the indication of the generator matrix. The operations of 1820 may be performed according to the methods described herein. In some examples, aspects of the operations of 1820 may be performed by a data unit generator as described with reference to FIGS. 6 through 9.

At 1825, the UE may allocate a first subset of the set of data units to a first carrier and a second subset of the set of data units to a second carrier. The operations of 1825 may be performed according to the methods described herein. In some examples, aspects of the operations of 1825 may be performed by a data unit allocator as described with reference to FIGS. 6 through 9.

At 1830, the UE may transmit the first subset of the set of data units over the first carrier and the second subset of the set of data units over the second carrier. The operations of 1830 may be performed according to the methods described herein. In some examples, aspects of the operations of 1830 may be performed by a data unit transmitter as described with reference to FIGS. 6 through 9.

Figure 19:
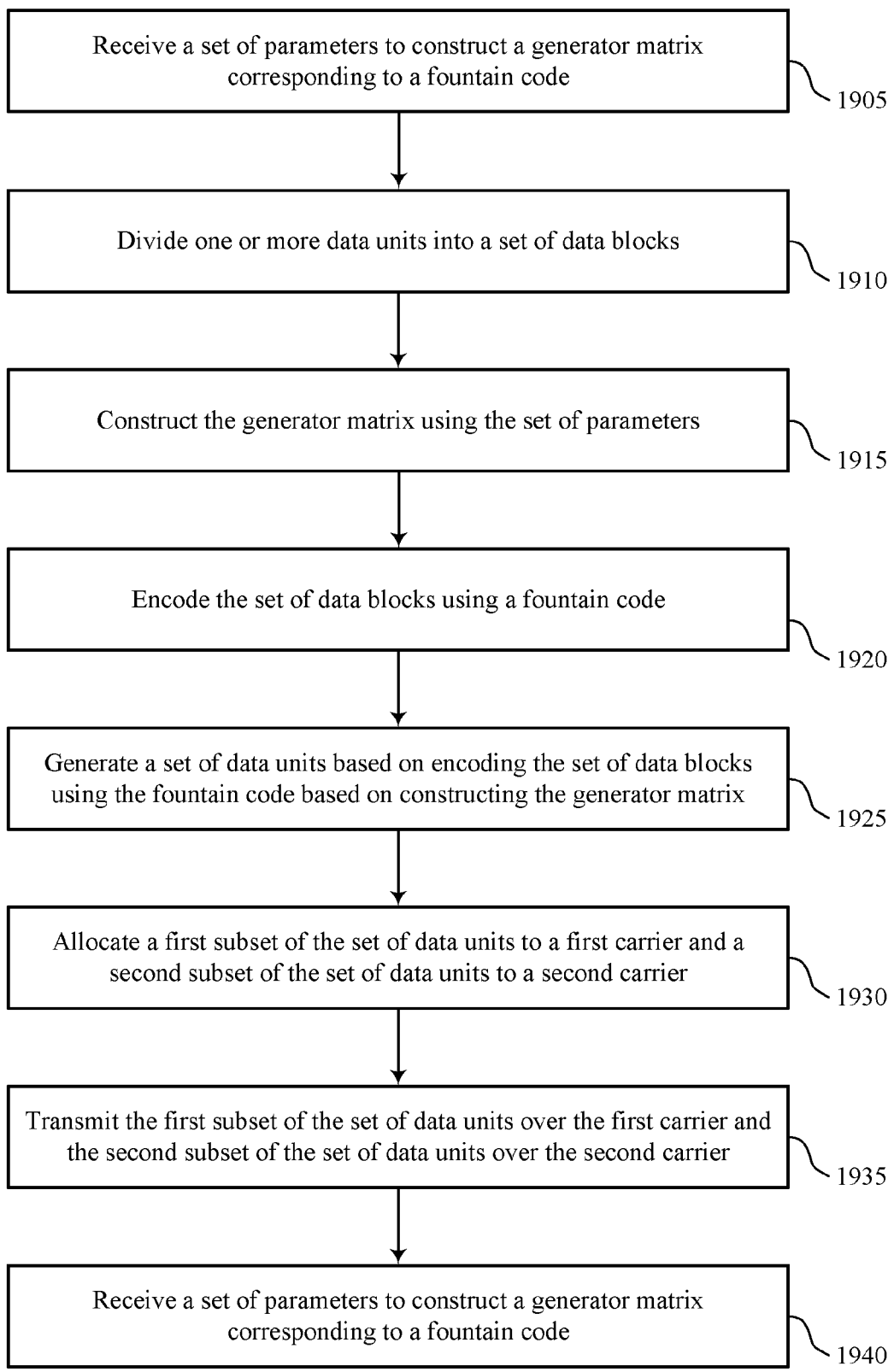

FIG. 19 shows a flowchart illustrating a method 1900 that supports low latency communication with carrier aggregation based fountain code operation in accordance with aspects of the present disclosure. The operations of method 1900 may be implemented by a UE 115 or its components as described herein. For example, the operations of method 1900 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 1905, the UE may receive a set of parameters to construct a generator matrix corresponding to a fountain code. The operations of 1905 may be performed according to the methods described herein. In some examples, aspects of the operations of 1905 may be performed by a control signaling receiver as described with reference to FIGS. 6 through 9.

At 1910, the UE may construct the generator matrix using the set of parameters. The operations of 1910 may be performed according to the methods described herein. In some examples, aspects of the operations of 1910 may be performed by a data unit generator as described with reference to FIGS. 6 through 9.

At 1915, the UE may divide one or more data units into a set of data blocks. The operations of 1915 may be performed according to the methods described herein. In some examples, aspects of the operations of 1915 may be performed by a data unit divider as described with reference to FIGS. 6 through 9.

At 1920, the UE may encode the set of data blocks using a fountain code. The operations of 1920 may be performed according to the methods described herein. In some examples, aspects of the operations of 1920 may be performed by a data block fountain encoder as described with reference to FIGS. 6 through 9.

At 1925, the UE may generate a set of data units based on encoding the set of data blocks using the fountain code. The operations of 1925 may be performed according to the methods described herein. In some examples, aspects of the operations of 1925 may be performed by a data unit generator as described with reference to FIGS. 6 through 9.

At 1930, the UE may allocate a first subset of the set of data units to a first carrier and a second subset of the set of data units to a second carrier. The operations of 1930 may be performed according to the methods described herein. In some examples, aspects of the operations of 1930 may be performed by a data unit allocator as described with reference to FIGS. 6 through 9.

At 1935, the UE may transmit the first subset of the set of data units over the first carrier and the second subset of the set of data units over the second carrier. The operations of 1935 may be performed according to the methods described herein. In some examples, aspects of the operations of 1935 may be performed by a data unit transmitter as described with reference to FIGS. 6 through 9.

At 1940, the UE may receive a set of parameters to construct a generator matrix corresponding to a fountain code. The operations of 1940 may be performed according to the methods described herein. In some examples, aspects of the operations of 1940 may be performed by a control signaling receiver as described with reference to FIGS. 6 through 9.

Figure 20:
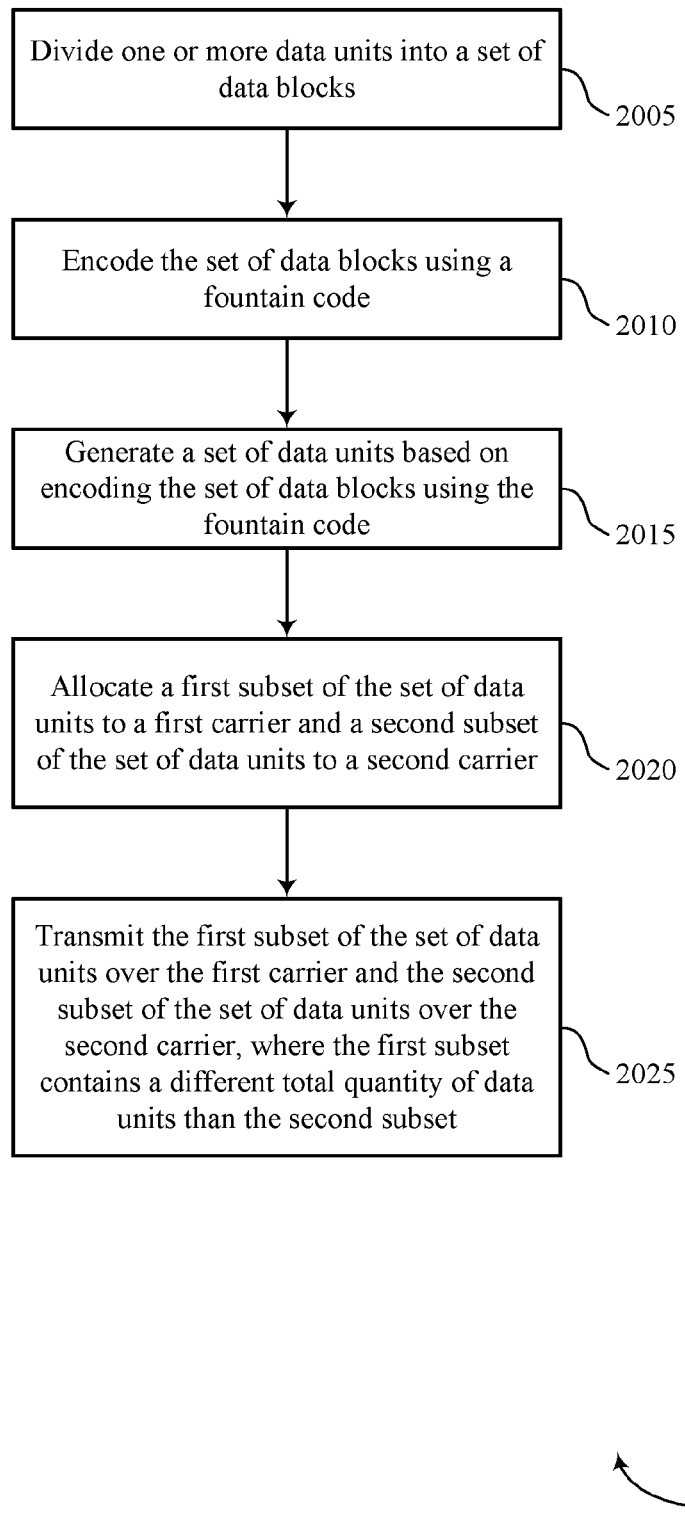

FIG. 20 shows a flowchart illustrating a method 2000 that supports low latency communication with carrier aggregation based fountain code operation in accordance with aspects of the present disclosure. The operations of method 2000 may be implemented by a UE 115 or its components as described herein. For example, the operations of method 2000 may be performed by a communication manager as described with reference to FIGS. 6 through 9. In some examples, a UE may execute a set of instructions to control the functional elements of the UE to perform the described functions. Additionally or alternatively, a UE may perform aspects of the described functions using special-purpose hardware.

At 2005, the UE may divide one or more data units into a set of data blocks. The operations of 2005 may be performed according to the methods described herein. In some examples, aspects of the operations of 2005 may be performed by a data unit divider as described with reference to FIGS. 6 through 9.

At 2010, the UE may encode the set of data blocks using a fountain code. The operations of 2010 may be performed according to the methods described herein. In some examples, aspects of the operations of 2010 may be performed by a data block fountain encoder as described with reference to FIGS. 6 through 9.

At 2015, the UE may generate a set of data units based on encoding the set of data blocks using the fountain code. The operations of 2015 may be performed according to the methods described herein. In some examples, aspects of the operations of 2015 may be performed by a data unit generator as described with reference to FIGS. 6 through 9.

At 2020, the UE may allocate a first subset of the set of data units to a first carrier and a second subset of the set of data units to a second carrier. The operations of 2020 may be performed according to the methods described herein. In some examples, aspects of the operations of 2020 may be performed by a data unit allocator as described with reference to FIGS. 6 through 9.

At 2025, the UE may transmit the first subset of the set of data units over the first carrier and the second subset of the set of data units over the second carrier, where the first subset contains a different total quantity of data units than a second subset. The operations of 2025 may be performed according to the methods described herein. In some examples, aspects of the operations of 2025 may be performed by a data unit transmitter as described with reference to FIGS. 6 through 9.

Figure 21:
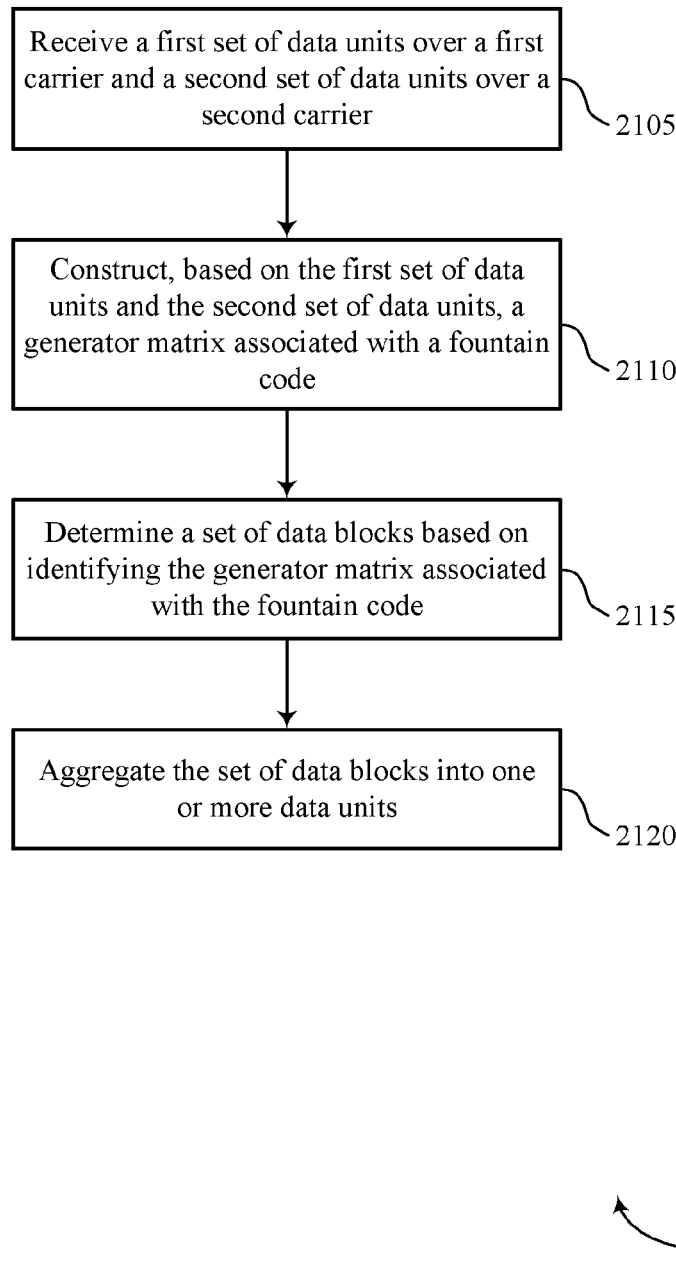

FIG. 21 shows a flowchart illustrating a method 2100 that supports low latency communication with carrier aggregation based fountain code operation in accordance with aspects of the present disclosure. The operations of method 2100 may be implemented by a base station 105 or its components as described herein. For example, the operations of method 2100 may be performed by a communication manager as described with reference to FIGS. 10 through 13. In some examples, a base station may execute a set of instructions to control the functional elements of the base station to perform the described functions. Additionally or alternatively, a base station may perform aspects of the described functions using special-purpose hardware.

At 2105, the base station may receive a first set of data units over a first carrier and a second set of data units over a second carrier. The operations of 2105 may be performed according to the methods described herein. In some examples, aspects of the operations of 2105 may be performed by a data unit receiver as described with reference to FIGS. 10 through 13.

At 2110, the base station may construct, based on the first set of data units and the second set of data units, a generator matrix associated with a fountain code. The operations of 2110 may be performed according to the methods described herein. In some examples, aspects of the operations of 2110 may be performed by a generator matrix constructor as described with reference to FIGS. 10 through 13.

At 2115, the base station may determine a set of data blocks based on identifying the generator matrix associated with the fountain code. The operations of 2115 may be performed according to the methods described herein. In some examples, aspects of the operations of 2115 may be performed by a data block determination component as described with reference to FIGS. 10 through 13.

At 2120, the base station may aggregate the set of data blocks into one or more data units. The operations of 2120 may be performed according to the methods described herein. In some examples, aspects of the operations of 2120 may be performed by a data block aggregator as described with reference to FIGS. 10 through 13.

The methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
receiving, via radio resource control signaling, a set of parameters to construct a generator matrix corresponding to a fountain code;
constructing the generator matrix using the set of parameters;
dividing one or more data units into a set of data blocks;
encoding the set of data blocks using the fountain code;
generating a set of data units based at least in part on encoding the set of data blocks using the fountain code and constructing the generator matrix;

allocating a first subset of the set of data units to a first carrier and a second subset of the set of data units to a second carrier; and transmitting the first subset of the set of data units over the first carrier and the second subset of the set of data units over the second carrier.

2. The method of claim 1, further comprising:

receiving, via the radio resource control signaling, an indication of a total quantity of data blocks for the set of data blocks and an indication of a total quantity of data units for the set of data units, wherein dividing the one or more data units into the set of data blocks is based at least in part on the indicated total quantity of data blocks and wherein generating the set of data units is based at least in part on the indicated total quantity of data units.

3. The method of claim 1, wherein transmitting the first subset of the set of data units over the first carrier and the second subset of the set of data units over the second carrier comprises:

transmitting the first subset of the set of data units containing a different total quantity of data units than the second subset of the set of data units.

4. The method of claim 3, further comprising:

comparing a channel condition of the first carrier with a channel condition of the second carrier, wherein the allocating comprises allocating the first subset of the set of data units to the first carrier and the second subset of the set of data units to the second carrier such that the first subset of the set of data units contains a different total quantity of data units from the second subset of the set of data units based at least in part on comparing the channel condition of the first carrier with the channel condition of the second carrier.

5. The method of claim 4, wherein comparing the channel condition of the first carrier with the channel condition of the second carrier comprises:

determining that the first carrier has a higher link quality than the second carrier, wherein the allocating comprises allocating the first subset of the set of data units to the first carrier and the second subset of the set of data units to the second carrier such that the first subset of the set of data units contains a greater quantity of total data units than the second subset of the set of data units based at least in part on determining that the first carrier has a higher link quality than the second carrier.

6. The method of claim 4, further comprising:

transmitting a third subset of a second set of data units over the first carrier before transmitting the first subset of the set of data units, wherein the allocating comprises allocating the first subset of the set of data units to the first carrier such that the first subset of the set of data units contains a different total quantity of data units than the third subset based at least in part on comparing the channel condition of the first carrier with the channel condition of the second carrier.

7. The method of claim 1, wherein at least one data unit of the set of data units transmitted comprises a header indicating whether the at least one data unit was encoded using the fountain code.

8. A method for wireless communication, comprising:

receiving an indication of a generator matrix corresponding to a fountain code;

dividing one or more data units into a set of data blocks;

encoding the set of data blocks using the fountain code;

generating a set of data units based at least in part on encoding the set of data blocks using the fountain code and receiving the indication of the generator matrix;

allocating a first subset of the set of data units to a first carrier and a second subset of the set of data units to a second carrier; and transmitting the first subset of the set of data units over the first carrier and the second subset of the set of data units over the second carrier.

9. A method for wireless communication, comprising:

receiving a first plurality of data units over a first carrier and a second plurality of data units over a second carrier;

constructing, based at least in part on the first plurality of data units and the second plurality of data units, a generator matrix associated with a fountain code;

determining a set of data blocks based at least in part on constructing the generator matrix; and aggregating the set of data blocks into one or more data units.

10. The method of claim 9, further comprising:

transmitting, via radio resource control signaling, an indication of a total quantity of data blocks of the set of data blocks, an indication of a total quantity of data units of a set of data units, or both.

11. The method of claim 9, further comprising:

transmitting an indication of a mother generator matrix corresponding to the generator matrix.

12. The method of claim 9, further comprising:

transmitting, via radio resource control signaling, a set of parameters to construct a mother generator matrix.

13. The method of claim 9, wherein receiving the first plurality of data units over the first carrier and the second plurality of data units over the second carrier comprises:

receiving the first plurality of data units comprising a different total quantity of data units than the second plurality of data units.

14. The method of claim 13, wherein receiving the first plurality of data units over the first carrier and the second plurality of data units over the second carrier comprises:

receiving the first plurality of data units comprising a different total quantity of data units than the second plurality of data units when a channel condition of the first carrier is different than a channel condition of the second carrier.

15. The method of claim 14, wherein receiving the first plurality of data units comprising the different quantity of data units than the second plurality of data units comprises:

receiving the first plurality of data units containing a greater total quantity of data units than the second carrier when the first carrier has a higher link quality than the second carrier.

16. The method of claim 13, further comprising:

receiving a third plurality of data units on the first carrier before receiving the first plurality of data units, wherein a total quantity of data units of the third plurality of data units is different than a total quantity of data units of the first plurality of data units when a channel condition associated with the first carrier while receiving the third plurality of data units is different than a channel condition associated with the first carrier while receiving the first plurality of data units.

17. An apparatus for wireless communication, comprising:

one or more processors, one or more memories in electronic communication with the one or more processors, and instructions stored in the one or more memories and executable by the one or more processors to cause the apparatus to:

receive, via radio resource control signaling, a set of parameters to construct a generator matrix corresponding to a fountain code;

construct the generator matrix using the set of parameters;

divide one or more data units into a set of data blocks;

encode the set of data blocks using the fountain code;

generate a set of data units based at least in part on encoding the set of data blocks using the fountain code and constructing the generator matrix;

allocate a first subset of the set of data units to a first carrier and a second subset of the set of data units to a second carrier; and transmit the first subset of the set of data units over the first carrier and the second subset of the set of data units over the second carrier.

18. The apparatus of claim 17, wherein the instructions are further executable by the one or more processors to cause the apparatus to:

receive, via the radio resource control signaling, an indication of a total quantity of data blocks for the set of data blocks and an indication of a total quantity of data units for the set of data units, wherein dividing the one or more data units into the set of data blocks is based at least in part on the indicated total quantity of data blocks and wherein generating the set of data units is based at least in part on the indicated total quantity of data units.

19. The apparatus of claim 17, wherein the instructions to transmit the first subset of the set of data units over the first carrier and the second subset of the set of data units over the second carrier are executable by the one or more processors to cause the apparatus to:

transmit the first subset of the set of data units containing a different total quantity of data units than the second subset of the set of data units.

20. The apparatus of claim 19, wherein the instructions are further executable by the one or more processors to cause the apparatus to:

compare a channel condition of the first carrier with a channel condition of the second carrier, wherein the allocating comprises allocating the first subset of the set of data units to the first carrier and the second subset of the set of data units to the second carrier such that the first subset of the set of data units contains a different total quantity of data units from the second subset of the set of data units based at least in part on comparing the channel condition of the first carrier with the channel condition of the second carrier.

21. The apparatus of claim 20, wherein the instructions to compare the channel condition of the first carrier with the channel condition of the second carrier are executable by the one or more processors to cause the apparatus to:

determine that the first carrier has a higher link quality than the second carrier, wherein the allocating comprises allocating the first subset of the set of data units to the first carrier and the second subset of the set of data units to the second carrier such that the first subset of the set of data units contains a greater quantity of total data units than the second subset of the set of data units based at least in part on determining that the first carrier has a higher link quality than the second carrier.

22. The apparatus of claim 20, wherein the instructions are further executable by the one or more processors to cause the apparatus to:

transmit a third subset of a second set of data units over the first carrier before transmitting the first subset of the set of data units, wherein the allocating comprises allocating the first subset of the set of data units to the first carrier such that the first subset of the set of data units contains a different total quantity of data units than the third subset based at least in part on comparing the channel condition of the first carrier with the channel condition of the second carrier.

23. The apparatus of claim 17, wherein at least one data unit of the set of data units transmitted comprises a header indicating whether the at least one data unit was encoded using the fountain code.

24. An apparatus for wireless communication, comprising:

one or more processors, one or more memories in electronic communication with the one or more processors, and instructions stored in the one or more memories and executable by the one or more processors to cause the apparatus to:

receive an indication of a generator matrix corresponding to a fountain code;

divide one or more data units into a set of data blocks;

encode the set of data blocks using the fountain code;

generate a set of data units based at least in part on encoding the set of data blocks using the fountain code and receiving the indication of the generator matrix;

allocate a first subset of the set of data units to a first carrier and a second subset of the set of data units to a second carrier; and transmit the first subset of the set of data units over the first carrier and the second subset of the set of data units over the second carrier.

25. An apparatus for wireless communication, comprising:

one or more processors, one or more memories in electronic communication with the one or more processors, and instructions stored in the one or more memories and executable by the one or more processors to cause the apparatus to:

receive a first plurality of data units over a first carrier and a second plurality of data units over a second carrier;

construct, based at least in part on the first plurality of data units and the second plurality of data units, a generator matrix associated with a fountain code;

determine a set of data blocks based at least in part on constructing the generator matrix; and aggregate the set of data blocks into one or more data units.

26. The apparatus of claim 25, wherein the instructions are further executable by the one or more processors to cause the apparatus to:

transmit, via radio resource control signaling, an indication of a total quantity of data blocks of the set of data blocks, an indication of a total quantity of data units of a set of data units, or both.

27. The apparatus of claim 25, wherein the instructions are further executable by the one or more processors to cause the apparatus to:

transmit an indication of a mother generator matrix corresponding to the generator matrix.

28. The apparatus of claim 25, wherein the instructions are further executable by the one or more processors to cause the apparatus to:

transmit, via radio resource control signaling, a set of parameters to construct a mother generator matrix.

29. The apparatus of claim 25, wherein the instructions to receive the first plurality of data units over the first carrier and the second plurality of data units over the second carrier are executable by the one or more processors to cause the apparatus to:
receive the first plurality of data units comprising a different total quantity of data units than the second plurality of data units.

30. The apparatus of claim 29, wherein the instructions to receive the first plurality of data units over the first carrier and the second plurality of data units over the second carrier are executable by the one or more processors to cause the apparatus to:
receive the first plurality of data units comprising a different total quantity of data units than the second plurality of data units when a channel condition of the first carrier is different than a channel condition of the second carrier.

31. The apparatus of claim 30, wherein the instructions to receive the first plurality of data units over the first carrier and the second plurality of data units over the second carrier are executable by the one or more processors to cause the apparatus to:
receive the first plurality of data units containing a greater total quantity of data units than the second carrier when the first carrier has a higher link quality than the second carrier.

32. The apparatus of claim 29, wherein the instructions are further executable by the one or more processors to cause the apparatus to:
receive a third plurality of data units on the first carrier before receiving the first plurality of data units, wherein a total quantity of data units of the third plurality of data units is different than a total quantity of data units of the first plurality of data units when a channel condition associated with the first carrier while receiving the third plurality of data units is different than a channel condition associated with the first carrier while receiving the first plurality of data units.

33. An apparatus for wireless communication, comprising:
means for receiving, via radio resource control signaling, a set of parameters to construct a generator matrix corresponding to a fountain code;
means for constructing the generator matrix using the set of parameters;
means for dividing one or more data units into a set of data blocks;
means for encoding the set of data blocks using the fountain code;
means for generating a set of data units based at least in part on encoding the set of data blocks using the fountain code and constructing the generator matrix;
means for allocating a first subset of the set of data units to a first carrier and a second subset of the set of data units to a second carrier; and
means for transmitting the first subset of the set of data units over the first carrier and the second subset of the set of data units over the second carrier.

* * * * *